(12) United States Patent
Van De Ven

(10) Patent No.: US 8,506,114 B2
(45) Date of Patent: Aug. 13, 2013

(54) LIGHTING DEVICES, METHODS OF LIGHTING, LIGHT FILTERS AND METHODS OF FILTERING LIGHT

(75) Inventor: Antony Paul Van De Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 821 days.

(21) Appl. No.: 12/035,604

(22) Filed: Feb. 22, 2008

(65) Prior Publication Data

US 2008/0259589 A1 Oct. 23, 2008

Related U.S. Application Data

(60) Provisional application No. 60/891,148, filed on Feb. 22, 2007.

(51) Int. Cl.
*F21V 9/00* (2006.01)

(52) U.S. Cl.
USPC ........... 362/231; 362/228; 362/230; 362/227; 362/235; 362/249.01; 362/249.02

(58) Field of Classification Search
USPC ............ 362/227, 228, 230, 231, 235, 249.01, 362/249.02
See application file for complete search history.

(56) References Cited

U.S. PATENT DOCUMENTS

| | | |
|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,749,260 A * | 6/1988 | Yang et al. ............ 359/275 |
| 4,772,885 A | 9/1988 | Uehara et al. |
| 5,087,883 A | 2/1992 | Hoffman |

(Continued)

FOREIGN PATENT DOCUMENTS

| CN | 1326230 | 12/2001 |
|---|---|---|
| DE | 3 916 875 | 12/1990 |

(Continued)

OTHER PUBLICATIONS 2003-373240, Mar. 2003, Derwent, Nachtigall et al.*

(Continued)

*Primary Examiner* — William Carter
(74) *Attorney, Agent, or Firm* — Burr & Brown

(57) ABSTRACT

A lighting device comprising a white light source, a filter which filters blue light from the white light, and a second light source which emits red light and/or reddish-orange light. In some embodiments, the white light source comprises a solid state light emitter. A method of lighting, comprising illuminating a white light source, illuminating a red and/or reddish-orange light source, the light sources being positioned and oriented such that the light mixes, and filtering blue light from the mixed light. A method of lighting, comprising illuminating a white light source, filtering blue light from the white light, and illuminating a red and/or reddish-orange light source. A light filter, comprising a first filter component which has a wall region and a window region, and a second filter component comprising two or more reflection regions. Also, methods of filtering.

38 Claims, 18 Drawing Sheets

(56) References Cited

U.S. PATENT DOCUMENTS

| | | | |
|---|---|---|---|
| 5,166,815 A | 11/1992 | Elderfield | |
| 5,264,997 A | 11/1993 | Hutchisson et al. | |
| 5,407,799 A | 4/1995 | Studier | |
| 5,410,519 A | 4/1995 | Hall et al. | |
| 5,477,436 A | 12/1995 | Bertling et al. | |
| 5,563,849 A | 10/1996 | Hall et al. | |
| 5,803,579 A | 9/1998 | Turnbull et al. | |
| 5,813,752 A | 9/1998 | Singer et al. | |
| 5,851,063 A | 12/1998 | Doughty et al. | |
| 5,959,316 A | 9/1999 | Lowery | |
| 6,066,861 A | 5/2000 | Hohn et al. | |
| 6,076,936 A | 6/2000 | George | |
| 6,084,250 A | 7/2000 | Justel et al. | |
| 6,095,666 A | 8/2000 | Salam | |
| 6,132,072 A | 10/2000 | Turnbull et al. | |
| 6,153,971 A | 11/2000 | Shimizu et al. | |
| 6,212,213 B1 | 4/2001 | Weber et al. | |
| 6,234,648 B1 | 5/2001 | Borner et al. | |
| 6,252,254 B1 | 6/2001 | Soules | |
| 6,255,670 B1 | 7/2001 | Srivastava et al. | |
| 6,278,135 B1 | 8/2001 | Srivastava et al. | |
| 6,292,901 B1 | 9/2001 | Lys et al. | |
| 6,294,800 B1 | 9/2001 | Duggal et al. | |
| 6,319,425 B1 | 11/2001 | Tasaki et al. | |
| 6,335,538 B1 | 1/2002 | Prutchi et al. | |
| 6,337,536 B1 | 1/2002 | Matsubara et al. | |
| 6,348,766 B1 | 2/2002 | Ohishi et al. | |
| 6,350,041 B1 | 2/2002 | Tarsa et al. | |
| 6,357,889 B1 | 3/2002 | Duggal et al. | |
| 6,394,621 B1 | 5/2002 | Hanewinkel | |
| 6,429,583 B1 | 8/2002 | Levinson et al. | |
| 6,441,558 B1 | 8/2002 | Muthu et al. | |
| 6,480,299 B1 | 11/2002 | Drakopoulos et al. | |
| 6,501,100 B1 | 12/2002 | Srivastava et al. | |
| 6,504,179 B1 | 1/2003 | Ellens et al. | |
| 6,513,949 B1 | 2/2003 | Marshall et al. | |
| 6,522,065 B1 | 2/2003 | Srivastava et al. | |
| 6,538,371 B1 | 3/2003 | Duggal et al. | |
| 6,550,949 B1 | 4/2003 | Bauer et al. | |
| 6,552,495 B1 | 4/2003 | Chang | |
| 6,577,073 B2 | 6/2003 | Shimizu et al. | |
| 6,578,986 B2 | 6/2003 | Swaris et al. | |
| 6,592,810 B2 | 7/2003 | Nishida et al. | |
| 6,600,175 B1 | 7/2003 | Baretz et al. | |
| 6,600,324 B2 | 7/2003 | St-Germain | |
| 6,603,258 B1 | 8/2003 | Mueller-Mach et al. | |
| 6,608,485 B2 | 8/2003 | St-Germain | |
| 6,616,862 B2 | 9/2003 | Srivastava et al. | |
| 6,624,350 B2 | 9/2003 | Nixon et al. | |
| 6,636,003 B2 | 10/2003 | Rahm et al. | |
| 6,642,666 B1 | 11/2003 | St-Germain | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,703,173 B2 | 3/2004 | Lu et al. | |
| 6,712,486 B1 | 3/2004 | Popovich et al. | |
| 6,737,801 B2 | 5/2004 | Ragle | |
| 6,744,194 B2 | 6/2004 | Fukasawa et al. | |
| 6,762,563 B2 | 7/2004 | St-Germain | |
| 6,784,463 B2 | 8/2004 | Camras et al. | |
| 6,791,257 B1 | 9/2004 | Sato et al. | |
| 6,817,735 B2 | 11/2004 | Shimizu et al. | |
| 6,841,804 B1 | 1/2005 | Chen et al. | |
| 6,851,834 B2 | 2/2005 | Leysath | |
| 6,880,954 B2 | 4/2005 | Ollett et al. | |
| 6,882,101 B2 | 4/2005 | Ragle | |
| 6,914,267 B2 | 7/2005 | Fukasawa et al. | |
| 6,936,857 B2 | 8/2005 | Doxsee et al. | |
| 6,967,116 B2 | 11/2005 | Negley | |
| 6,980,176 B2 | 12/2005 | Matsumoto et al. | |
| 7,005,679 B2 | 2/2006 | Tarsa et al. | |
| 7,008,078 B2 | 3/2006 | Shimizu et al. | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,061,454 B2 | 6/2006 | Sasuga et al. | |
| 7,066,623 B2 | 6/2006 | Lee et al. | |
| 7,083,302 B2 | 8/2006 | Chen et al. | |
| 7,093,958 B2 | 8/2006 | Coushaine | |
| 7,095,056 B2 | 8/2006 | Vitta et al. | |
| 7,102,172 B2 | 9/2006 | Lynch et al. | |
| 7,116,308 B1 | 10/2006 | Heeks et al. | |
| 7,118,262 B2 | 10/2006 | Negley et al. | |
| 7,125,143 B2 | 10/2006 | Hacker | |
| 7,135,664 B2 | 11/2006 | Vornsand et al. | |
| 7,144,121 B2 | 12/2006 | Minano et al. | |
| 7,164,231 B2 | 1/2007 | Choi et al. | |
| 7,207,691 B2 | 4/2007 | Lee et al. | |
| 7,213,940 B1 | 5/2007 | Van De Ven et al. | |
| 7,215,074 B2 | 5/2007 | Shimizu et al. | |
| 7,232,212 B2 | 6/2007 | Iwase | |
| 7,239,085 B2 | 7/2007 | Kawamura | |
| 7,250,715 B2 | 7/2007 | Mueller et al. | |
| 7,255,457 B2 | 8/2007 | Ducharme et al. | |
| 7,256,557 B2 | 8/2007 | Lim | |
| 7,322,732 B2 | 1/2008 | Negley et al. | |
| 7,329,024 B2 | 2/2008 | Lynch et al. | |
| 7,358,954 B2 | 4/2008 | Negley | |
| 7,365,485 B2 | 4/2008 | Fukasawa et al. | |
| 7,387,405 B2 | 6/2008 | Ducharme et al. | |
| 7,422,504 B2 | 9/2008 | Maeda et al. | |
| 7,453,195 B2 | 11/2008 | Radkov | |
| 7,474,044 B2 | 1/2009 | Ge | |
| 7,479,662 B2 | 1/2009 | Soules et al. | |
| 2001/0002049 A1 | 5/2001 | Reeh et al. | |
| 2001/0013592 A1* | 8/2001 | Gwak et al. | 252/301.4 R |
| 2002/0006044 A1 | 1/2002 | Harbers et al. | |
| 2002/0039002 A1 | 4/2002 | Fukasawa et al. | |
| 2002/0070681 A1 | 6/2002 | Shimizu et al. | |
| 2002/0087532 A1 | 7/2002 | Barritz et al. | |
| 2002/0149576 A1 | 10/2002 | Tanaka et al. | |
| 2003/0026096 A1 | 2/2003 | Ellens et al. | |
| 2003/0030063 A1 | 2/2003 | Sosniak | |
| 2003/0067773 A1 | 4/2003 | Marshall et al. | |
| 2003/0146411 A1 | 8/2003 | Srivastava et al. | |
| 2003/0222268 A1 | 12/2003 | Yocom et al. | |
| 2004/0046178 A1 | 3/2004 | Sano | |
| 2004/0105261 A1 | 6/2004 | Ducharme et al. | |
| 2004/0105264 A1 | 6/2004 | Spero | |
| 2004/0212998 A1 | 10/2004 | Mohacsi | |
| 2004/0217364 A1 | 11/2004 | Tarsa et al. | |
| 2004/0218387 A1 | 11/2004 | Gerlach | |
| 2004/0218388 A1 | 11/2004 | Suzuki | |
| 2004/0239839 A1 | 12/2004 | Hong | |
| 2004/0264193 A1 | 12/2004 | Okumura | |
| 2004/0264212 A1 | 12/2004 | Chung et al. | |
| 2005/0007306 A1 | 1/2005 | Iisaka et al. | |
| 2005/0052378 A1 | 3/2005 | Hacker | |
| 2005/0082974 A1 | 4/2005 | Fukasawa et al. | |
| 2005/0190141 A1 | 9/2005 | Roth et al. | |
| 2005/0231946 A1* | 10/2005 | Guthrie | 362/231 |
| 2005/0231976 A1 | 10/2005 | Keuper et al. | |
| 2005/0243556 A1 | 11/2005 | Lynch | |
| 2005/0251698 A1 | 11/2005 | Lynch et al. | |
| 2005/0255907 A1* | 11/2005 | Gauselmann et al. | 463/20 |
| 2005/0259423 A1 | 11/2005 | Heuser et al. | |
| 2005/0274972 A1 | 12/2005 | Roth et al. | |
| 2006/0012989 A1 | 1/2006 | Lee | |
| 2006/0022582 A1 | 2/2006 | Radkov | |
| 2006/0040416 A1 | 2/2006 | Sano | |
| 2006/0060872 A1 | 3/2006 | Edmond et al. | |
| 2006/0067073 A1 | 3/2006 | Ting | |
| 2006/0071589 A1 | 4/2006 | Radkov | |
| 2006/0072314 A1* | 4/2006 | Rains | 362/231 |
| 2006/0105482 A1 | 5/2006 | Alferink et al. | |
| 2006/0113548 A1 | 6/2006 | Chen et al. | |
| 2006/0138435 A1 | 6/2006 | Tarsa et al. | |
| 2006/0138937 A1 | 6/2006 | Ibbetson | |
| 2006/0141466 A1* | 6/2006 | Pinet et al. | 435/6 |
| 2006/0152140 A1 | 7/2006 | Brandes | |
| 2006/0152172 A9 | 7/2006 | Mueller et al. | |
| 2006/0180818 A1 | 8/2006 | Nagai et al. | |
| 2006/0181192 A1 | 8/2006 | Radkov | |
| 2006/0245184 A1 | 11/2006 | Galli | |

| | | | | | |
|---|---|---|---|---|---|
| 2007/0001188 A1 | 1/2007 | Lee | EP | 1 760 795 | 1/2006 |
| 2007/0001994 A1 | 1/2007 | Roth | JP | 04-159519 | 6/1992 |
| 2007/0041220 A1 | 2/2007 | Lynch | JP | 09-146089 | 6/1997 |
| 2007/0051966 A1 | 3/2007 | Higashi et al. | JP | 10-163535 | 6/1998 |
| 2007/0090381 A1 | 4/2007 | Otsuka et al. | JP | 2000-022222 | 1/2000 |
| 2007/0137074 A1 | 6/2007 | Van De Ven et al. | JP | 2000-183408 | 6/2000 |
| 2007/0139920 A1* | 6/2007 | Van De Ven et al. ......... 362/235 | JP | 2000-214462 | 8/2000 |
| 2007/0139923 A1 | 6/2007 | Negley | JP | 2001-111114 | 4/2001 |
| 2007/0159091 A1 | 7/2007 | Hirosaki et al. | JP | 2001-156331 | 6/2001 |
| 2007/0164268 A1* | 7/2007 | Curran et al. .................. 257/13 | JP | 2001-307506 | 11/2001 |
| 2007/0170447 A1 | 7/2007 | Negley | JP | 2002-150821 | 5/2002 |
| 2007/0171145 A1 | 7/2007 | Coleman et al. | JP | 2003-515956 | 5/2003 |
| 2007/0202623 A1 | 8/2007 | Gao | JP | 2003-529889 | 10/2003 |
| 2007/0223219 A1 | 9/2007 | Medendorp et al. | JP | 2004-080046 | 3/2004 |
| 2007/0236911 A1 | 10/2007 | Negley | JP | 2004-103443 | 4/2004 |
| 2007/0247414 A1 | 10/2007 | Robert | JP | 2004-253309 | 9/2004 |
| 2007/0247847 A1 | 10/2007 | Villard | JP | 2004-356116 | 12/2004 |
| 2007/0259206 A1* | 11/2007 | Oshio ........................... 428/690 | JP | 2004-363055 | 12/2004 |
| 2007/0262337 A1 | 11/2007 | Villard | JP | 2005-005482 | 1/2005 |
| 2007/0263393 A1 | 11/2007 | Van De Ven et al. | JP | 2005-101296 | 4/2005 |
| 2007/0267983 A1 | 11/2007 | Van De Ven et al. | JP | 2005-142311 | 6/2005 |
| 2007/0274063 A1 | 11/2007 | Negley | JP | 2006-236749 | 9/2006 |
| 2007/0274080 A1 | 11/2007 | Negley et al. | JP | 2007-122950 | 5/2007 |
| 2007/0276606 A1 | 11/2007 | Radkov | JP | 2007-141737 | 6/2007 |
| 2007/0278503 A1 | 12/2007 | Van De Ven et al. | TW | 546854 | 8/2003 |
| 2007/0278934 A1 | 12/2007 | Van De Ven et al. | WO | 98/43014 | 10/1998 |
| 2007/0278974 A1 | 12/2007 | Van De Ven | WO | 99/66483 | 12/1999 |
| 2007/0279440 A1 | 12/2007 | Negley | WO | 00/34709 | 6/2000 |
| 2007/0279903 A1 | 12/2007 | Negley | WO | 01/41215 | 6/2001 |
| 2007/0280624 A1 | 12/2007 | Negley et al. | WO | 01/43113 | 6/2001 |
| 2008/0084685 A1 | 4/2008 | Van De Ven | WO | 01/69692 | 9/2001 |
| 2008/0084700 A1 | 4/2008 | Van De Ven | WO | 03/056876 | 7/2003 |
| 2008/0084701 A1 | 4/2008 | Van De Ven et al. | WO | 03/091771 | 11/2003 |
| 2008/0088248 A1 | 4/2008 | Myers | WO | 2004/068909 | 8/2004 |
| 2008/0089053 A1 | 4/2008 | Negley | WO | 2005/004202 | 1/2005 |
| 2008/0106895 A1 | 5/2008 | Van De Ven | WO | 2005/004202 A2 | 1/2005 |
| 2008/0106907 A1 | 5/2008 | Trott et al. | WO | 2005013365 | 2/2005 |
| 2008/0112168 A1 | 5/2008 | Pickard et al. | WO | 2005/013365 | 10/2005 |
| 2008/0112170 A1 | 5/2008 | Trott et al. | WO | 2005/124877 | 12/2005 |
| 2008/0112183 A1 | 5/2008 | Negley | WO | 2005124877 | 12/2005 |
| 2008/0130265 A1 | 6/2008 | Negley | WO | WO 2005/124877 | 12/2005 |
| 2008/0130285 A1 | 6/2008 | Negley | WO | 2006/028312 | 3/2006 |
| 2008/0136313 A1 | 6/2008 | Negley et al. | WO | 2007/061758 | 5/2007 |
| 2008/0137347 A1 | 6/2008 | Trott et al. | | | |
| 2008/0170396 A1 | 7/2008 | Yuan et al. | | | |
| 2008/0179602 A1 | 7/2008 | Negley | | | |

OTHER PUBLICATIONS

White Light LED, Part Nos. NSPW300BS and NSPW312BS, High Brightness LEDs, Nov. 12, 1999, Publisher: Nichia Corporation.

Chhajed, S., *Influence of junction temperature on chromaticity and color-rendering properties of trichromatic white-light sources* . . . , Journal of Applied Physics, 2005, vol. 97pp. 1-8.

Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.

Color Kinetics Inc., *Color Quality of Intelligent Solid-State Light Systems*, Color Quality of Solid-State Light Sources, Mar. 2005, pp. 1-3.

Compound Semiconductors Online, "LED Lighting Fixtures, Inc. Sets World Record at 80 Lumens per Watt for Warm White", Compound Semiconductors Online, May 30, 2006, pp. 1.

Cree, Inc., "Cree® Xlamp® 7090 XR-E Series LED Binning and Labeling," Application Note: CLD-AP08.000, 7pp (2006).

CSA International, "Test Data Report," Project No. 1786317, Report No. 1786317-1 (Apr. 2006).

DOE SSL CALiPer Report, "Product Test Reference: CALiPER 07-31 Downlight Lamp".

DOE SSL CALiPer Report, "Product Test Reference: CALiPER 07-47 Downlight Lamp".

Krames et al., *Lumileds Lighting, Light from Silicon Valley*, Progress and Future Direction of LED Technology, SSL Workshop, Nov. 13, 2003, Publisher: Limileds Lighting Inc., pp. 1-21.

Narendran et al., "Solid State lighting: failure analysis of white LEDs," Journal of Cystal Growth, vol. 268, Issues 1-4, Aug. 2004, Abstract.

Narendran et al., *Color Rendering Properties of LED Light Sources*, 2002, pp. 1-8.

| | | | |
|---|---|---|---|
| 2008/0192462 A1 | 8/2008 | Steedly et al. | |
| 2008/0192493 A1 | 8/2008 | Villard | |
| 2008/0211416 A1 | 9/2008 | Negley et al. | |
| 2008/0231201 A1 | 9/2008 | Higley et al. | |
| 2008/0259589 A1 | 10/2008 | Van De Ven et al. | |
| 2008/0278928 A1 | 11/2008 | Van De Ven et al. | |
| 2008/0278940 A1 | 11/2008 | Van De Ven et al. | |
| 2008/0278950 A1 | 11/2008 | Pickard et al. | |
| 2008/0278952 A1 | 11/2008 | Trott et al. | |
| 2008/0304260 A1 | 12/2008 | Van De Ven et al. | |
| 2008/0304261 A1 | 12/2008 | Van De Ven et al. | |
| 2008/0304269 A1 | 12/2008 | Pickard et al. | |
| 2008/0309255 A1 | 12/2008 | Myers | |
| 2008/0310154 A1 | 12/2008 | Van De Ven et al. | |
| 2009/0002986 A1 | 1/2009 | Medendorp et al. | |

FOREIGN PATENT DOCUMENTS

| | | |
|---|---|---|
| DE | 3916875 | 12/1990 |
| DE | 10140692 A2 * | 3/2003 |
| DE | 10-335077 | 3/2005 |
| EP | 0 838 866 | 4/1998 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 160 883 A2 | 12/2001 |
| EP | 1 193 772 | 4/2002 |
| EP | 1 193 772 A2 | 4/2002 |
| EP | 1 367 655 | 12/2003 |
| EP | 1 380 876 | 1/2004 |
| EP | 1 462 711 | 12/2004 |
| EP | 1 566 848 | 8/2005 |
| EP | 1 571 715 | 9/2005 |

Nichia, White Light LED, Part Nos. NSPW300BS and NSPW312BS, High Brightness LEDs, Nov. 12, 1999, Publisher: Nichia Corporation.

Press Release from LED Lighting Fixtures dated Apr. 24, 2006 entitled "LED Lighting Fixtures, Inc. achieves unprecedented gain in light output from new luminaire".

Press Release from LED Lighting Fixtures dated Feb. 16, 2006 entitled "LED Lighting Fixtures, Inc. Announces Record Performance".

Press Release from LED Lighting Fixtures dated Feb. 7, 2007 entitled "LED Lighting Fixtures Announces its first LED-based Recessed Down Light".

Press Release from LED Lighting Fixtures dated Jan. 26, 2006 entitled "LED Lighting Fixtures Creates 750 Lumen Recessed Light and Uses Only 16 Watts of Power".

Press Release from LED Lighting Fixtures dated May 30, 2006 entitled "LED Lighting Fixtures, Inc. Sets World Record at 80 Lumens per Watt for Warm White Fixture".

Press Release from LED Lighting Fixtures dated Nov. 28, 2007 entitled "New-Lamp from LED Lighting Fixtures Shatter World Record for Energy Efficiency".

Shimizu, "Development of High-Efficiency LED Downlight", First International Conference on White LEDs and Solid State Lighting, Nov. 30, 2007.

U.S. Department of Energy, "DOE Solid-State Lighting CALiPER Program, Summary of Results: Round 3 of Product Testing," Oct. 2007.

U.S. Department of Energy, "DOE Solid-State Lighting CALiPER Program, Summary of Results: Round 4 of Product Testing," Jan. 2008.

U.S. Department of Energy, "DOE Solid-State Lighting CALiPER Program, Summary of Results: Round 5 of Product Testing," May 2008.

Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.

Optoled Lighting Inc., *OptoLED Product Information*, 2009, Publisher: OptoLED GmBH website: accessed at http://222.optoled.de/englisch/products/led.html.

Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.

Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.

U.S. Appl. No. 11/613,692, filed Dec. 20, 2006.
U.S. Appl. No. 11/614,180, filed Dec. 21, 2006.
U.S. Appl. No. 11/613,714, filed Dec. 20, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/736,761, filed Apr. 18, 2007.
U.S. Appl. No. 11/736,799, filed Apr. 18, 2007.
U.S. Appl. No. 11/755,153, filed May 30, 2007.
U.S. Appl. No. 12/017,558, filed Jan. 22, 2008.
U.S. Appl. No. 11/755,162, filed May 30, 2007.
U.S. Appl. No. 11/856,421, filed Sep. 17, 2007.
U.S. Appl. No. 11/854,744, filed Sep. 13, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 12/117,122, filed May 8, 2008.
U.S. Appl. No. 12/117,131, filed May 8, 2008.
U.S. Appl. No. 11/843,243, filed Aug. 22, 2007.
U.S. Appl. No. 11/948,021, filed Nov. 30, 2007.
U.S. Appl. No. 11/939,052, filed Nov. 13, 2007.
U.S. Appl. No. 11/877,038, filed Oct. 23, 2007.
U.S. Appl. No. 11/870,679, filed Oct. 11, 2007.
U.S. Appl. No. 11/951,626, filed Dec. 6, 2007.
U.S. Appl. No. 11/948,041, filed Nov. 30, 2007.
U.S. Appl. No. 12/114,994, filed May 5, 2008.
U.S. Appl. No. 12/116,341, filed May 7, 2008.
U.S. Appl. No. 12/117,148, filed May 8, 2008.
U.S. Appl. No. 12/117,271, filed May 8, 2008.
U.S. Appl. No. 12/117,280, filed May 8, 2008.
U.S. Appl. No. 12/017,600, filed Jan. 22, 2008.
U.S. Appl. No. 12/017,676, filed Jan. 22, 2008.
U.S. Appl. No. 12/117,136, filed May 8, 2008.
U.S. Appl. No. 11/947,323, filed Nov. 29, 2007.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 11/939,059, filed Nov. 13, 2007.
U.S. Appl. No. 12/248,220, filed Oct. 9, 2008.
U.S. Appl. No. 12/277,745, filed Nov. 25, 2008.
U.S. Appl. No. 60/990,435, filed Nov. 27, 2007.
U.S. Appl. No. 61/075,513, filed Jun. 25, 2008.

Van de Ven et al., "Wanu White Illumination with High CRI and High Efficacy by Combining 455 nm Excited Yellowish Phosphor LEDs and Red AlInGaP LEDs", First International Conference on White LEDs and Solid State Lighting.

Cree® XLamp® 7090 XR-E Series LED Binning and Labeling.

U.S. Appl. No. 13/804,935, filed Mar. 14, 2013, Pickard et al.

* cited by examiner

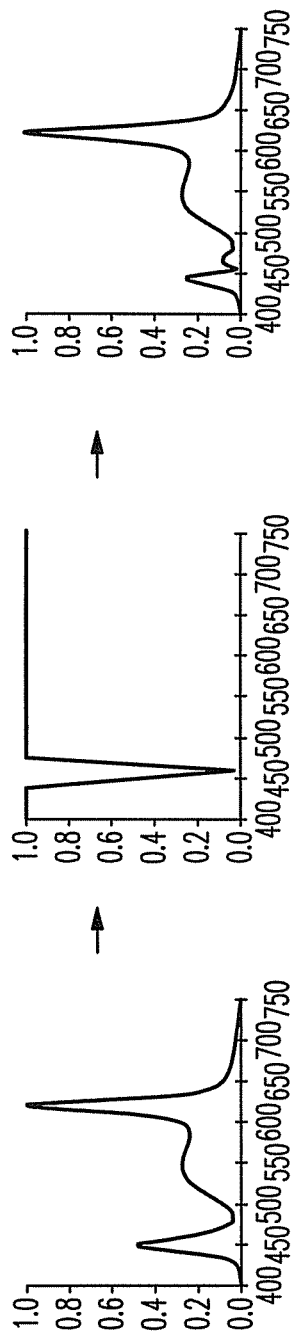
FIG.7C
FIG.7B
FIG.7A
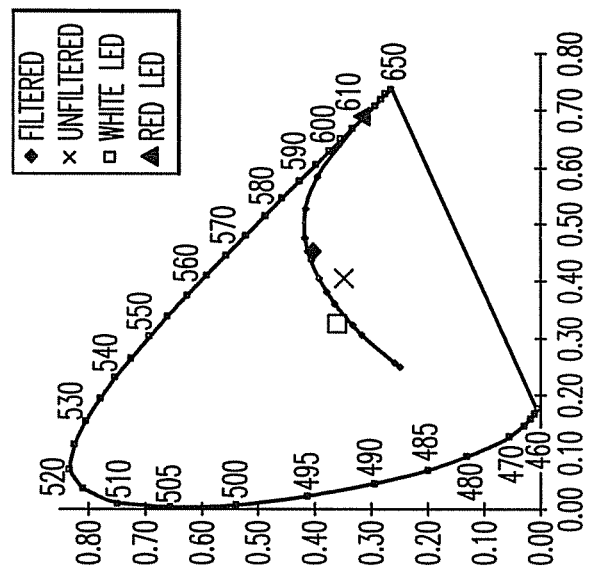
FIG.7D

LIGHTING DEVICES, METHODS OF LIGHTING, LIGHT FILTERS AND METHODS OF FILTERING LIGHT

CROSS-REFERENCE TO RELATED APPLICATIONS

This application claims the benefit of U.S. Provisional Patent Application No. 60/891,148, filed Feb. 22, 2008, the entirety of which is incorporated herein by reference.

FIELD OF THE INVENTION(S)

The present inventive subject matter relates to lighting devices and methods of lighting. In some aspects, the present inventive subject matter relates to lighting devices which include one or more solid state light emitters and/or one or more lumiphors. The present inventive subject matter also relates to light filters and methods of filtering light.

BACKGROUND OF THE INVENTION(S)

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Color reproduction is typically measured using the Color Rendering Index (CRI Ra). CRI Ra is a modified average of the relative measurement of how the color rendition of an illumination system compares to that of a reference radiator when illuminating with reference colors, i.e., it is a relative measure of the shift in surface color of an object when lit by a particular lamp. The CRI Ra equals 100 if the color coordinates of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80). Certain types of specialized lighting have very low CRI (e.g., mercury vapor or sodium lamps have Ra as low as about 40 or even lower), Sodium lights are used, e.g., to light highways—driver response time, however, significantly decreases with lower CRI Ra values (for any given brightness, legibility decreases with lower CRI Ra).

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (1 m/W), and/or duration of service. In addition, efforts have been ongoing to develop ways by which CRI Ra values of lights (e.g., fluorescent lights, solid state light emitter and incandescent lights) can be improved.

Because light that is perceived as white is necessarily a blend of light of two or more colors (or wavelengths), no single light emitting diode junction has been developed that can produce white light. "White" light emitting diode lamps have been produced which have a light emitting diode pixel/cluster formed of respective red, green and blue light emitting diodes. Another "white" LED lamp which has been produced includes (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

In general, the 1931 CIE Chromaticity Diagram (an international standard for primary colors established in 1931), and the 1976 CIE Chromaticity Diagram (similar to the 1931 Diagram but modified such that similar distances on the Diagram represent similar perceived differences in color) provide useful reference for defining colors as weighted sums of primary colors.

The CRI of efficient white LED lamps is generally low (Ra in the range 65-75) as compared to incandescent light sources (Ra of 100). Additionally the color temperature for LEDs is generally "cooler" (~5500K) and less desirable than the color temperature of incandescent or CCFL bulbs (~2700K). Both of these deficiencies in LEDs can be improved by the addition of other LEDs or lumiphors of selected saturated colors. As indicated above, light sources according to the present inventive subject matter can utilize specific color "blending" of light sources of specific (x,y) color chromaticity coordinates (see U.S. Patent Application No. 60/752,555, filed Dec. 21, 2005, entitled "Lighting Device and Lighting Method" (inventors: Antony Paul Van de Ven and Gerald H. Negley), the entirety of which is hereby incorporated by reference). For example, light from additional selected saturated sources can be mixed with the unsaturated broad spectrum source(s) to provide uniform illumination without any areas of discoloration; and if desired, for cosmetic reasons, the individual light emitters can be made to be not visible as discrete devices or discrete color areas when the illumination source or aperture is viewed directly.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (1 m/W), and/or duration of service, are not limited to any particular color or color blends of light.

Aspects related to the present inventive subject matter can be represented on either the 1931 CIE (Commission Internationale de l'Eclairage) Chromaticity Diagram or the 1976 CIE Chromaticity Diagram. FIG. 1 shows the 1931 CIE Chromaticity Diagram. FIG. 2 shows the 1976 Chromaticity Diagram. FIG. 3 shows an enlarged portion of the 1976 Chromaticity Diagram, in order to show the blackbody locus in more detail. Persons of skill in the art are familiar with these diagrams, and these diagrams are readily available (e.g., by searching "CIE Chromaticity Diagram" on the internet).

The CIE Chromaticity Diagrams map out the human color perception in terms of two CIE parameters x and y (in the case of the 1931 diagram) or u' and v' (in the case of the 1976 diagram). For a technical description of CIE chromaticity diagrams, see, for example, "Encyclopedia of Physical Science and Technology", vol. 7, 230-231 (Robert A Meyers ed., 1987). The spectral colors are distributed around the edge of the outlined space, which includes all of the hues perceived by the human eye. The boundary line represents maximum saturation for the spectral colors. As noted above, the 1976 CIE Chromaticity Diagram is similar to the 1931 Diagram, except that the 1976 Diagram has been modified such that similar distances on the Diagram represent similar perceived differences in color.

In the 1931 Diagram, deviation from a point on the Diagram can be expressed either in terms of the coordinates or, alternatively, in order to give an indication as to the extent of the perceived difference in color, in terms of MacAdam ellipses. For example, a locus of points defined as being ten MacAdam ellipses from a specified hue defined by a particular set of coordinates on the 1931 Diagram consists of hues which would each be perceived as differing from the specified hue to a common extent (and likewise for loci of points defined as being spaced from a particular hue by other quantities of MacAdam ellipses).

Since similar distances on the 1976 Diagram represent similar perceived differences in color, deviation from a point on the 1976 Diagram can be expressed in terms of the coordinates, u' and v', e.g., distance from the point=$(\Delta u'^2+\Delta v'^2)^{1/2}$, and the hues defined by a locus of points which are each a common distance from a specified hue consist of hues which would each be perceived as differing from the specified hue to a common extent.

The chromaticity coordinates and the CIE chromaticity diagrams illustrated in FIGS. 1-3 are explained in detail in a number of books and other publications, such as pages 98-107 of K. H. Butler, "Fluorescent Lamp Phosphors" (The Pennsylvania State University Press 1980) and pages 109-110 of G. Blasse et al., "Luminescent Materials" (Springer-Verlag 1994), both incorporated herein by reference.

The chromaticity coordinates (i.e., color points) that lie along the blackbody locus obey Planck's equation: $E(\lambda)= \lambda^{-5}/(e^{(B/T)}-1)$, where E is the emission intensity, $\lambda$ is the emission wavelength, T the color temperature of the blackbody and A and B are constants. Color coordinates that lie on or near the blackbody locus yield pleasing white light to a human observer. The 1976 CIE Diagram includes temperature listings along the blackbody locus. These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light which is on or near the blackbody locus can thus be described in terms of their color temperature.

Also depicted on the 1976 CIE Diagram are designations A, B, C, D and E, which refer to light produced by several standard illuminants correspondingly identified as illuminants A, B, C, D and E, respectively.

BRIEF SUMMARY OF THE INVENTION(S)

The present inventive subject matter provides methods and apparatus for improving the CRI Ra and the color temperature of high efficiency LED light sources and a unique and useful method of producing attractive white light.

Normally, spectra emissions from light sources are viewed in the mW/nm space. In such plots, if blue light is filtered, the difference in the spectra is large. As a result, it would be counterintuitive to suggest filtering blue light from the light emitted from a white light source as part of a method of improving the overall efficacy/CRI Ra characteristics of the white light source. The human eye, however, is not nearly as sensitive to blue light as it is to other colors. As a result, if a comparison is made between a plot of a lumens/nm spectra for white light vs. a plot of the lumens/nm spectra for the same white light with some of its blue light having been filtered, the difference is much smaller than is the case in corresponding respective plots of mW/nm.

In view of the fact that the sacrifice in lumens/nm is very small, according to the present inventive subject matter, it is possible to filter a portion of blue light contained in light emitted from a white light source to obtain filtered light, and then add red light ("supplemental light") to the filtered light to obtain white light with improved CRI Ra without sacrificing much efficacy. As a result, removing blue light does not affect the overall efficacy of such a lamp very much (typically only a few percent), nor do the lumens reduce much (typically 2%) because the human eye is not very sensitive to blue light. So while the blue milliwatts are reduced significantly (e.g., approximately 60% reduction) the overall lumen drop is only about 2%.

Similar analogous filtering and mixing can be done with any other light sources and other supplemental light colors, and the blue light filtering can be carried out at any stage, i.e., before or after (or during) mixing with the supplemental light.

According to a first aspect of the present inventive subject matter, there is provided a lighting device comprising:

a first light source which, if illuminated, emits white light;

a first filter which, if contacted by the white light emitted from the first light source, would filter at least some blue light from the white light to form modified light; and a second light source which, if illuminated, emits light of at least one color selected from among the group consisting of red light and reddish-orange light.

According to a second aspect of the present inventive subject matter, there is provided a method of lighting, comprising:

illuminating a first light source, whereby the first light source emits white light;

illuminating a second light source, whereby the second light source emits second light of at least one color selected from among the group consisting of red light and reddish-orange light, the first light source and the second light source being positioned and oriented relative to each other such that at least the white light and the second light mix to form first mixed light; and contacting the first mixed light with a first filter which filters from the first mixed light at least some blue light to form filtered mixed light.

According to a third aspect of the present inventive subject matter, there is provided a method of lighting, comprising:

illuminating a first light source, whereby the first light source emits white light;

contacting the white light with a first filter which filters from the white light at least some blue light to form modified light; and illuminating a second light source, whereby the second light source emits second light of at least one color selected from among the group consisting of red light and reddish-orange light, the first light source, the first filter and the second light source being positioned and oriented relative to each other such that at least the modified light and the second light mix to form mixed light.

According to a fourth aspect of the present inventive subject matter, there is provided a light filter, comprising:

at least a first filter component and a second filter component, the first filter component comprising at least a first wall region, the first wall region comprising at least one window region, the second filter component comprising at least a first reflection region and a second reflection region, wherein the first reflection region, if contacted by a first mixture of light which is white, would reflect a first reflected light which differs in color from a second reflection light which would be reflected by the second reflection region if the second reflection region were contacted by the first mixture of light, at least one of the first filter component and the second filter component being movable such that differing portions of the first reflection region can be exposed through the window region, such that if the first mixture of light enters the filter, a color of light exiting the filter can be adjusted by adjusting a positional relationship between the first filter component and the second filter component.

According to a fifth aspect of the present inventive subject matter, there is provided a method of lighting, comprising:

contacting light with a filter, the filter comprising at least a first filter component and a second filter component, the first filter component comprising at least a first wall region, the first wall region comprising at least one window region, the second filter component comprising at least a first reflection region and a second reflection region, wherein the first reflection region, if contacted by a first mixture of light which is white, would reflect a first reflected light which differs in color from a second reflection light which would be reflected by the second reflection region if the second reflection region were contacted by the first mixture of light, at least one of the first filter component and the second filter component being movable such that differing portions of the first reflection region can be exposed through the window region, such that a color of light exiting the filter can be adjusted by adjusting a positional relationship between the first filter component and the second filter component.

According to a sixth aspect of the present inventive subject matter, there is provided a method of lighting, comprising:

moving at least a first filter component of a filter relative to a second filter component of the filter, the first filter component comprising at least a first wall region, the first wall region comprising at least one window region, the second filter component comprising at least a first reflection region and a second reflection region, wherein the first reflection region, if contacted by a first mixture of light which is white, would reflect a first reflected light which differs in color from a second reflection light which would be reflected by the second reflection region if the second reflection region were contacted by the first mixture of light, at least one of the first filter component and the second filter component being movable such that differing portions of the first reflection region can be exposed through the window region, such that a color of light exiting the filter can be adjusted by adjusting a positional relationship between the first filter component and the second filter component.

In some embodiments according to the present inventive subject matter, the lighting device further comprises one or more additional light source which, if illuminated, emits white light.

In some embodiments according to the present inventive subject matter, the lighting device further comprises one or more additional light source which, if illuminated, emits light of at least one color selected from among the group consisting of red light and reddish-orange light.

In some embodiments according to the present inventive subject matter, the modified light, in the absence of any additional light, has x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

In some embodiments according to the present inventive subject matter, a mixture of light consisting of the modified light and light emitted from the second light source would produce mixed light, the mixed light being white light. In some such embodiments, the mixed light has x, y coordinates on a 1931 CIE Chromaticity Diagram which define a point which is within ten MacAdam ellipses of at least one point on the blackbody locus on a 1931 CIE Chromaticity Diagram.

The inventive subject matter may be more fully understood with reference to the accompanying drawings and the following detailed description of the inventive subject matter.

BRIEF DESCRIPTION OF THE DRAWING FIGURES

Figure 4A:
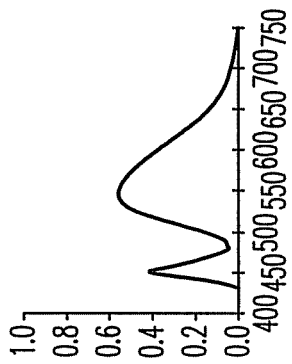
Figure 4B:
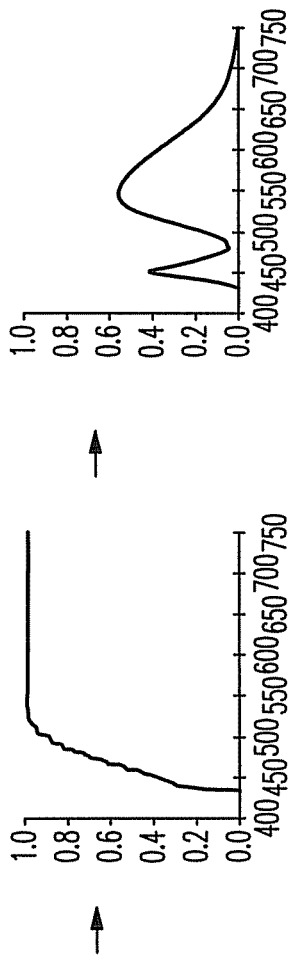
Figure 4C:
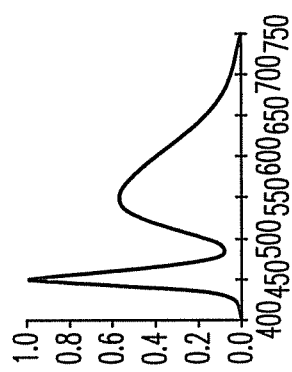
Figure 4D:
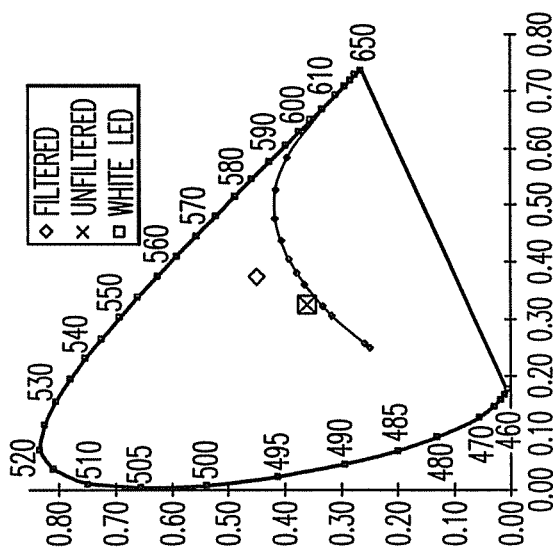

FIGS. 4A-4C are plots of relative intensity of unfiltered light vs. wavelength, ratio of entering light which exits the filter vs. wavelength and relative intensity of filtered light vs. wavelength for an example where a yellowish-green light is created from a standard white lamp, a red lamp and a pale yellow filter, and FIG. 4D is a 1931 CIE diagram showing the white light, the unfiltered light and the filtered light for this example.

Figure 5C:
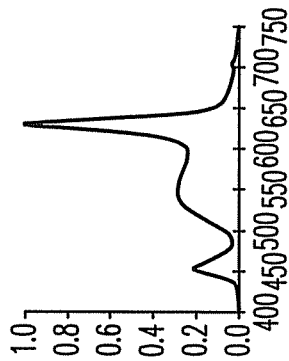
Figure 5B:
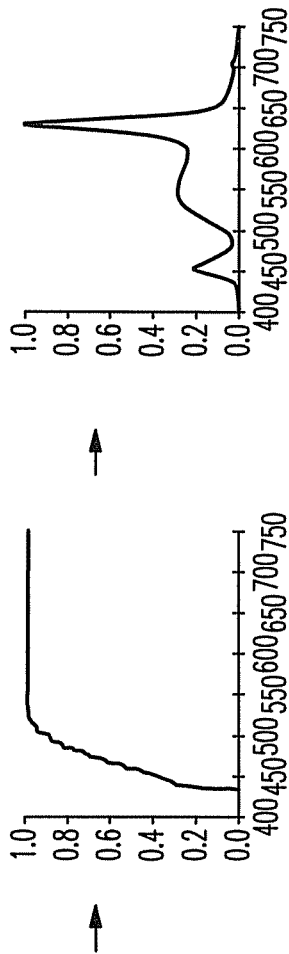
Figure 5A:
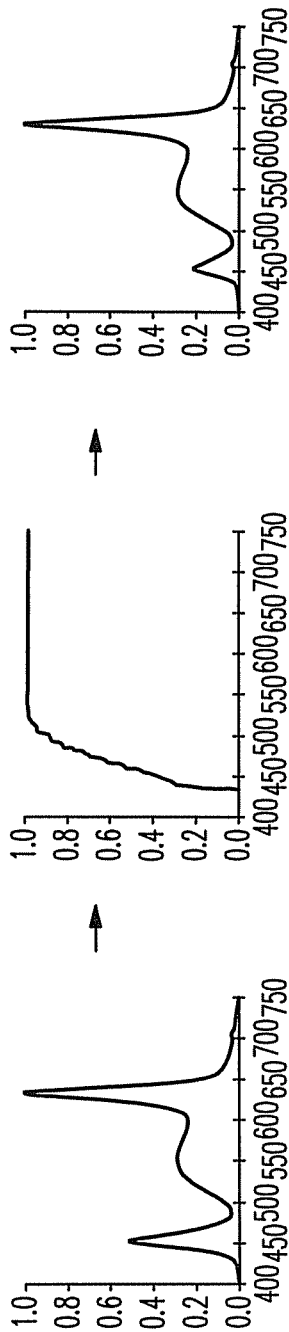
Figure 5D:
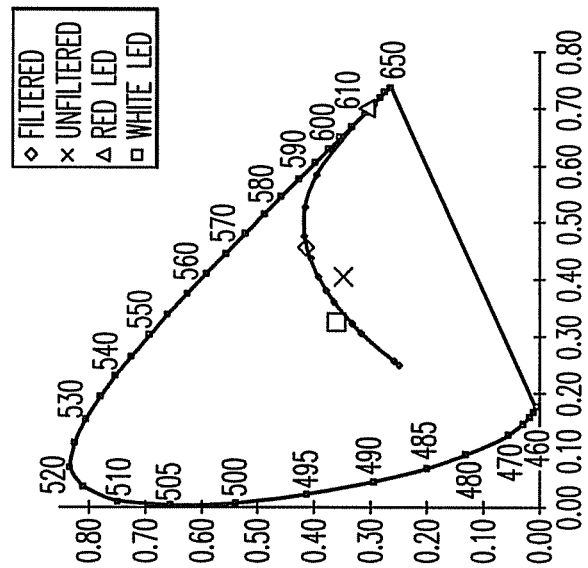

FIGS. 5A-5C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow filter, and FIG. 5D is a 1931 CIE diagram showing the white light, the red light, the unfiltered light and the filtered light for this example.

Figure 6C:
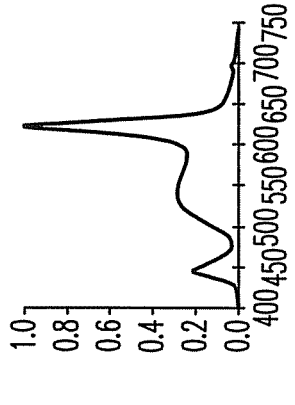
Figure 6B:
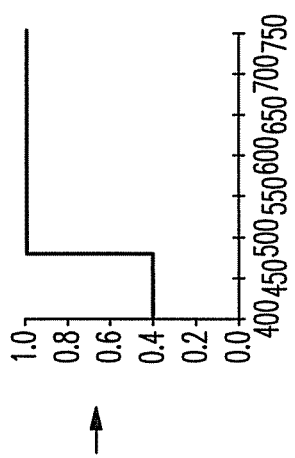
Figure 6A:
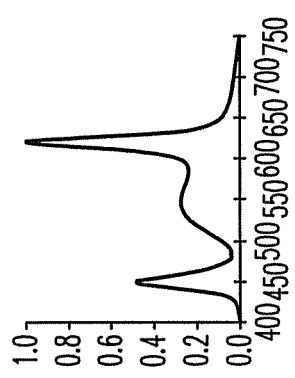
Figure 6D:
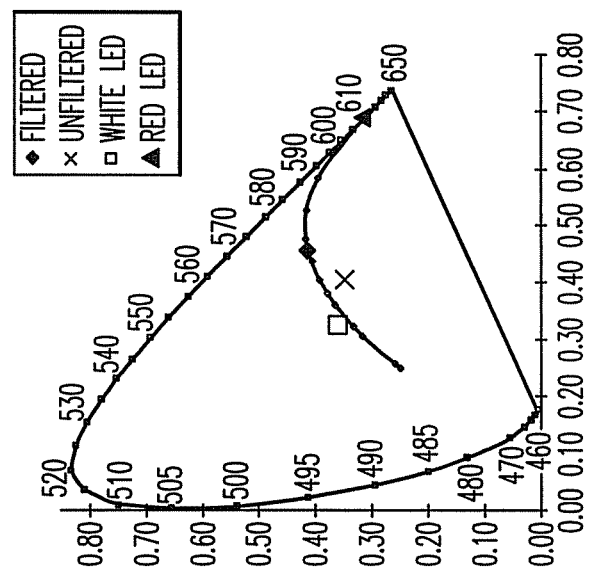

FIGS. 6A-6C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow stepped low pass filter, and FIG. 6D is a 1931 CIE diagram showing the white light, the unfiltered light and the filtered light for this example, FIGS. 7A-7C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow notch filter, and FIG. 7D is a 1931 CIE diagram showing the white light, the red light, the unfiltered light and the filtered light for this example.

Figure 8A:
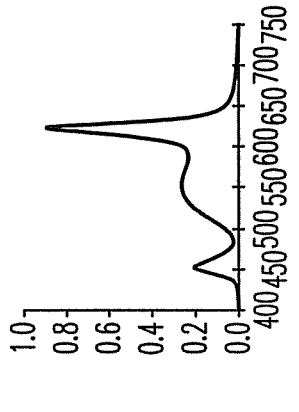
Figure 8B:
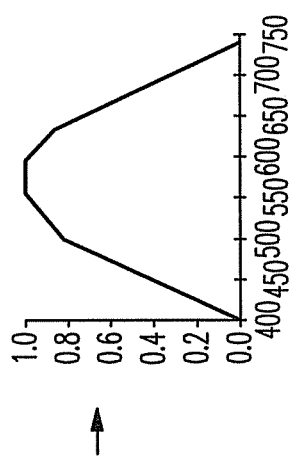
Figure 8C:
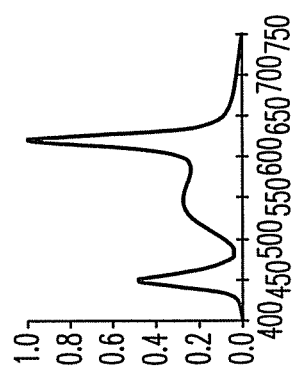
Figure 8D:
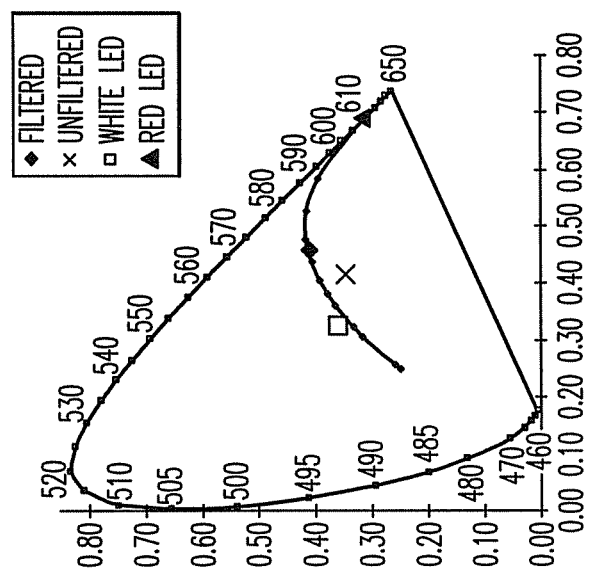

FIGS. 8A-8C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow bandpass filter, and FIG. 8D is a 1931 CIE diagram showing the white light, the red light, the unfiltered light and the filtered light for this example.

Figure 9A:
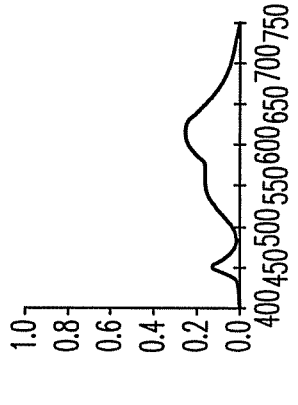
Figure 9B:
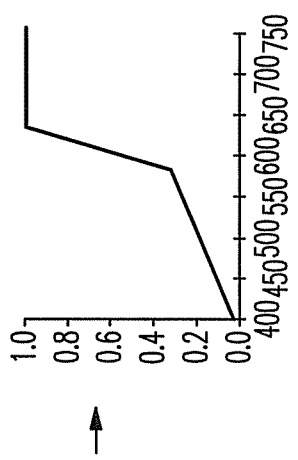
Figure 9C:
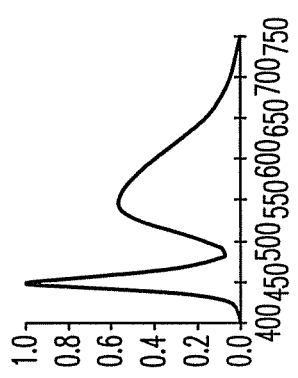
Figure 9D:
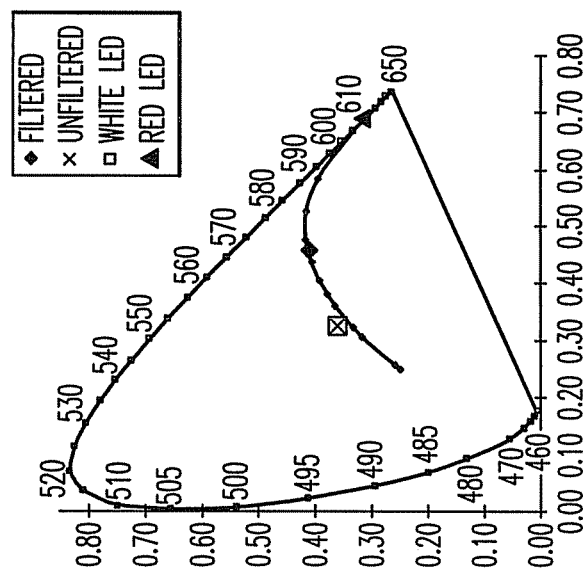

FIGS. 9A-9C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow lowpass filter, and FIG. 9D is a 1931 CIE diagram showing the white light, the red light, the unfiltered light and the filtered light for this example.

Figure 10:
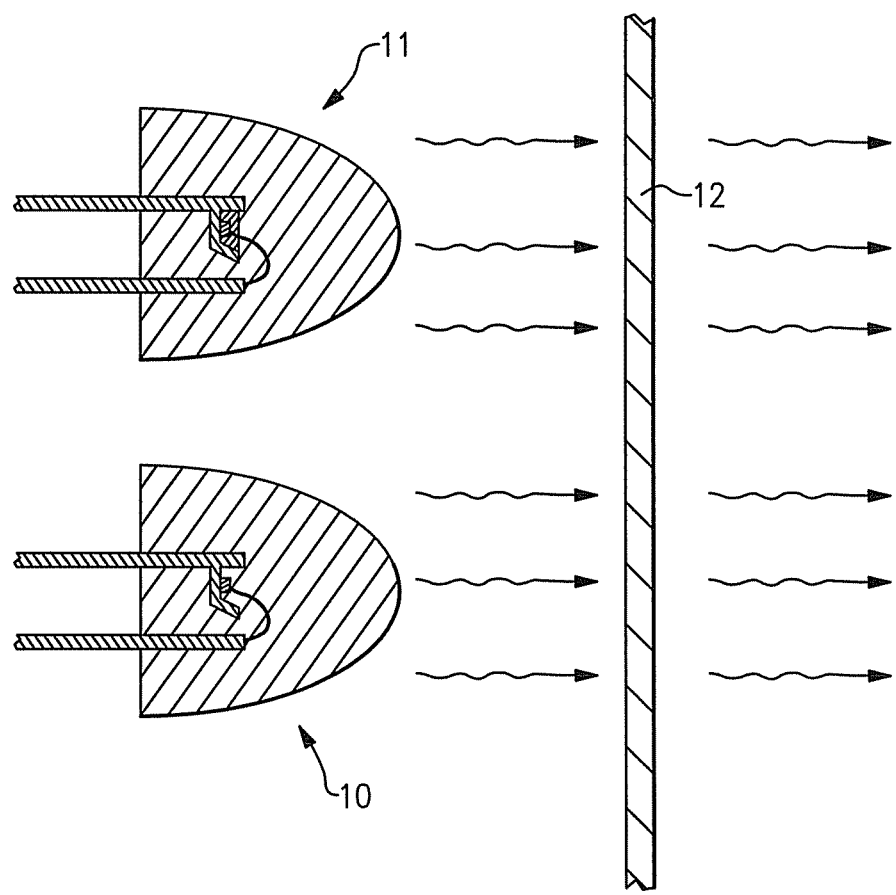

FIG. 10 depicts a representative embodiment of a lighting device according to the present inventive subject matter.

Figure 11:
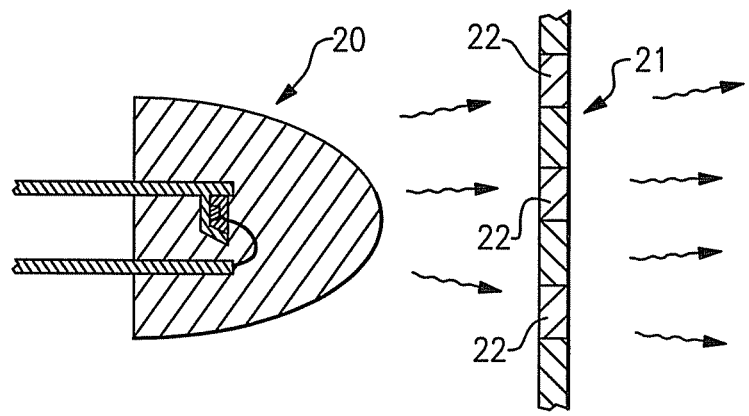

FIG. 11 depicts a representative embodiment of a lighting device according to the present inventive subject matter.

Figure 12:
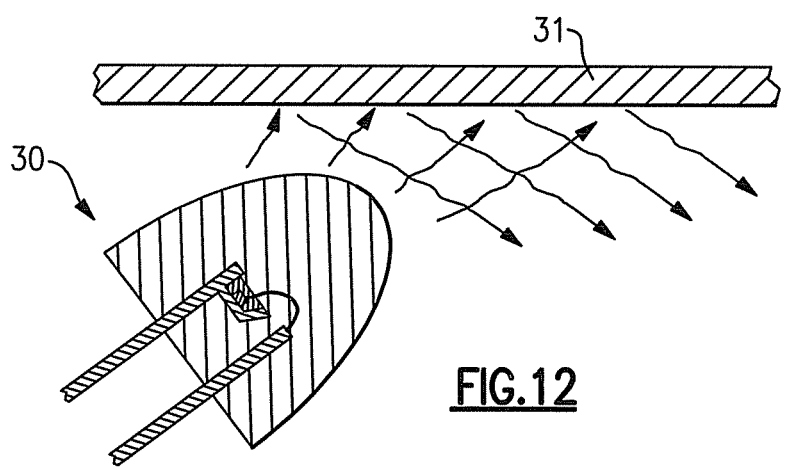

FIG. 12 depicts a representative embodiment of a lighting device according to the present inventive subject matter.

Figure 13:
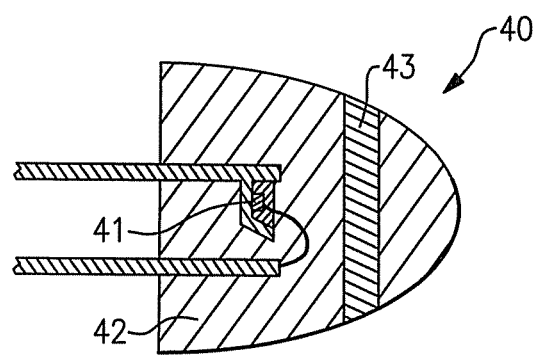

FIG. 13 depicts a representative embodiment of a lighting device according to the present inventive subject matter.

Figure 14:
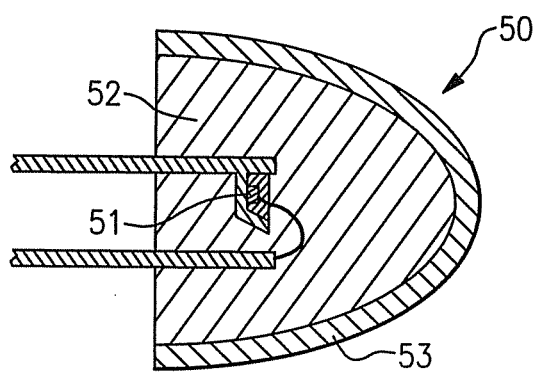

FIG. 14 depicts a representative embodiment of a lighting device according to the present inventive subject matter.

Figure 15:
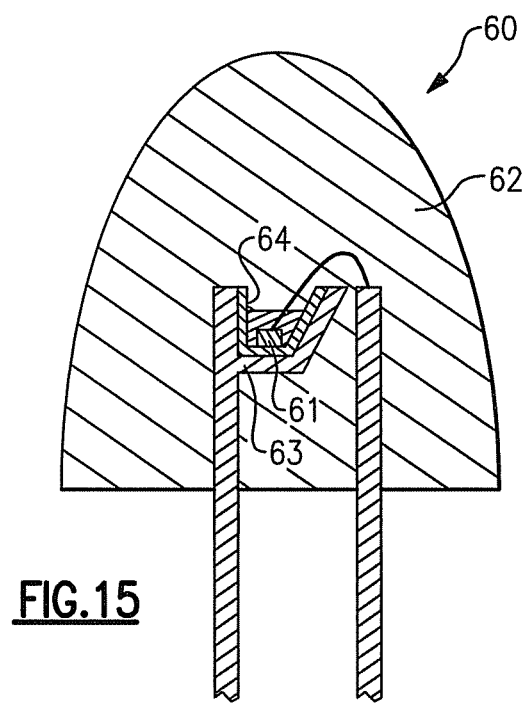

FIG. 15 depicts a representative embodiment of a lighting device according to the present inventive subject matter.

Figure 16:
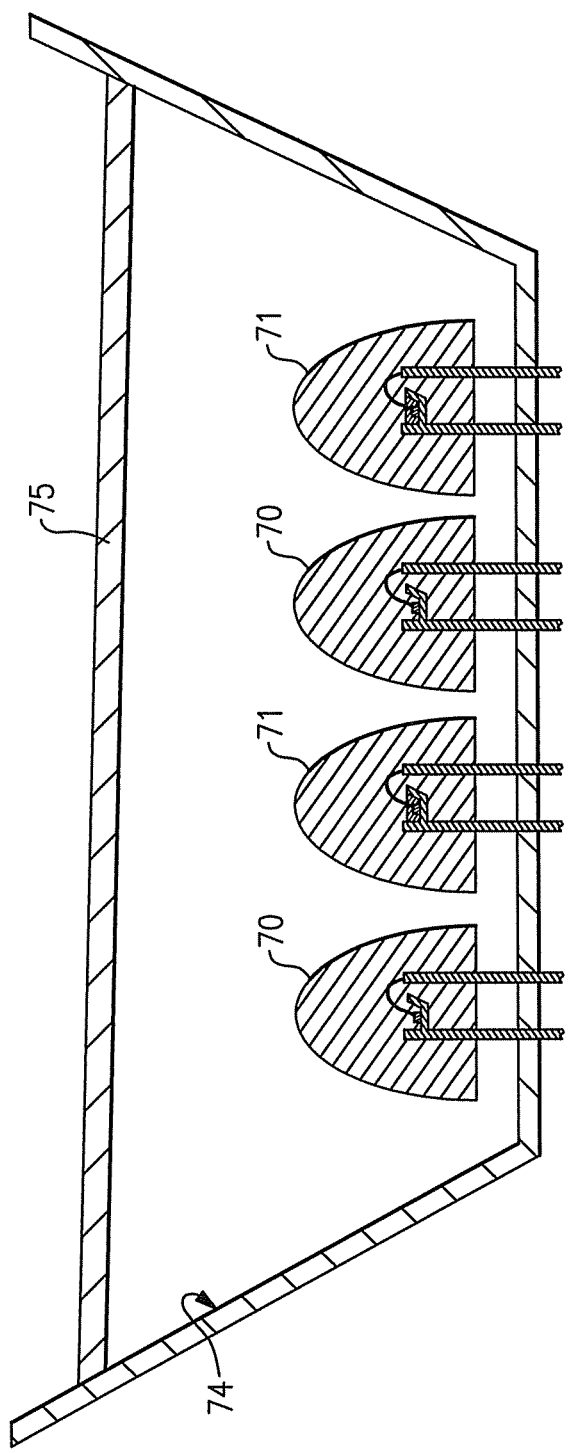

FIG. 16 depicts a representative embodiment of a lighting device according to the present inventive subject matter.

Figure 17:
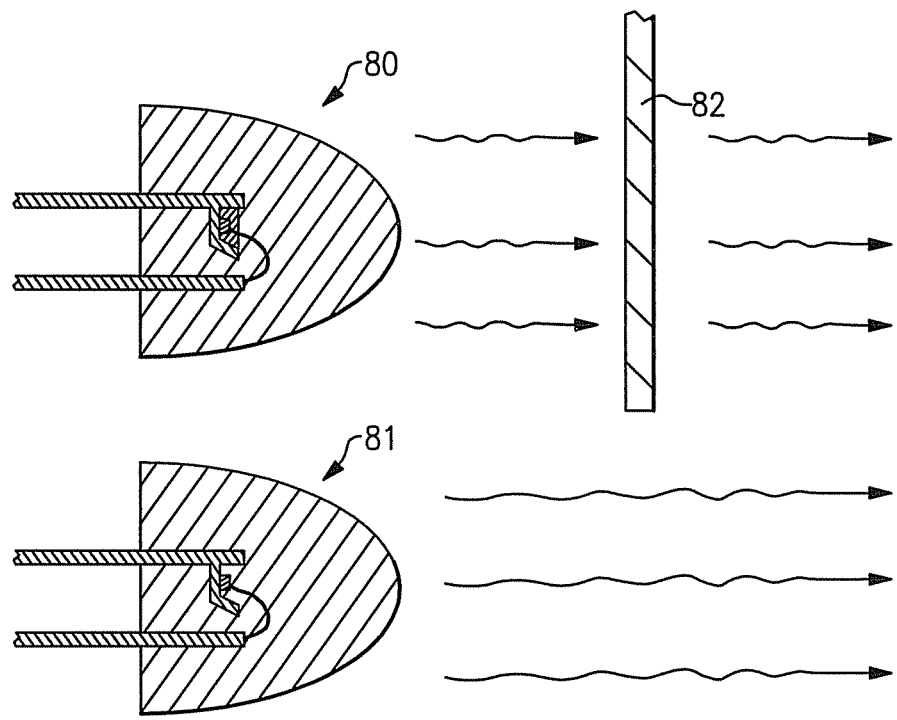

FIG. 17 depicts a representative embodiment of a lighting device according to the present inventive subject matter.

Figure 18:
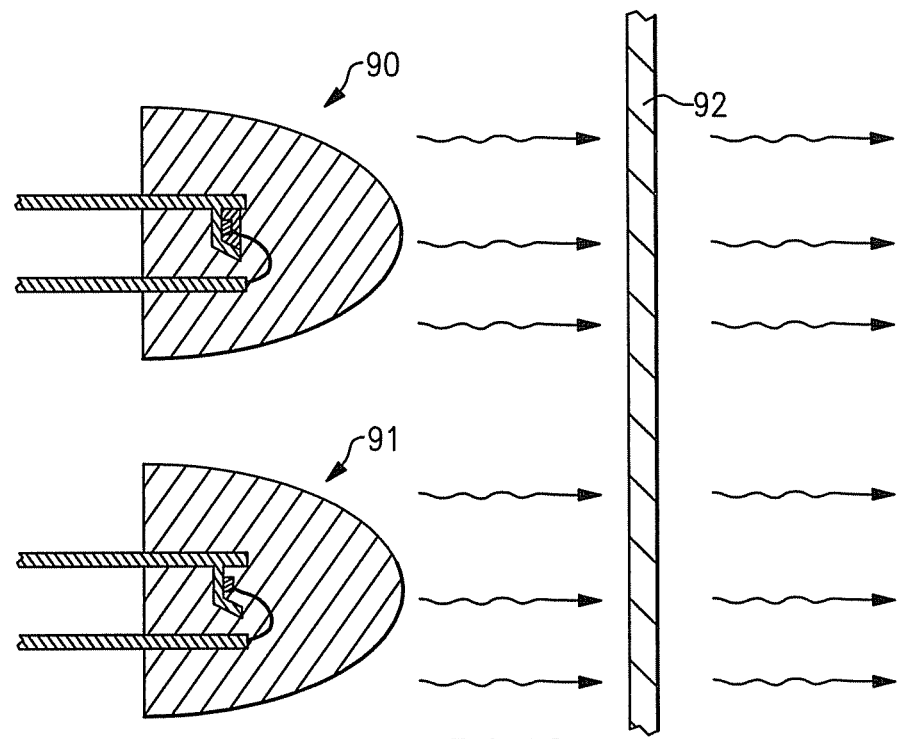

FIG. 18 depicts a representative embodiment of a lighting device according to the present inventive subject matter.

Figure 19:
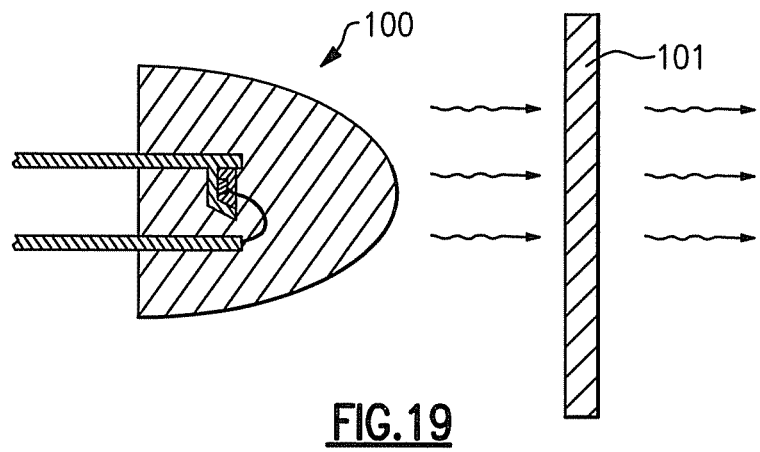

FIG. 19 depicts a representative embodiment of a lighting device according to the present inventive subject matter.

Figure 20:
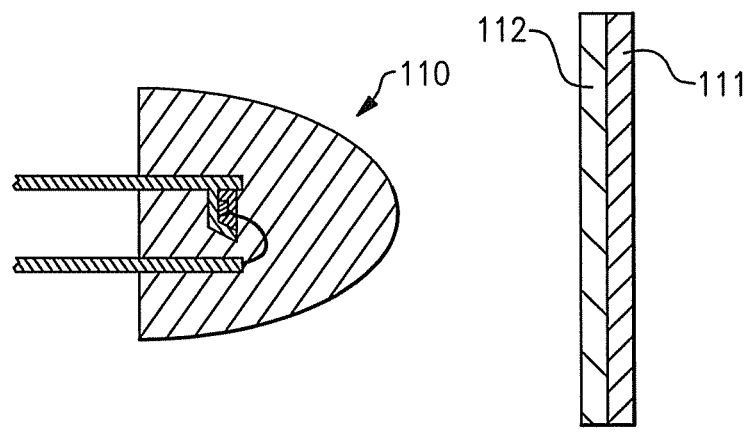

FIG. 20 depicts a representative embodiment of a lighting device according to the present inventive subject matter.

Figure 21:
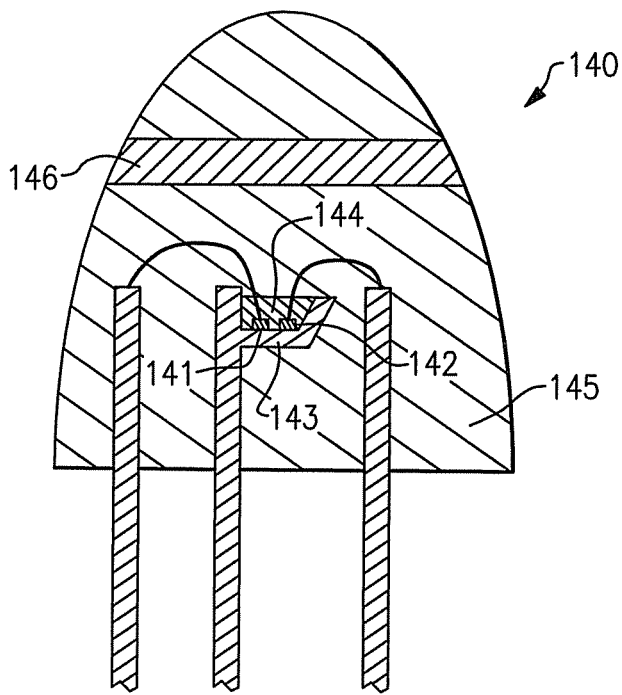

FIG. 21 depicts a representative embodiment of a light filter according to the present inventive subject matter.

Figure 22:
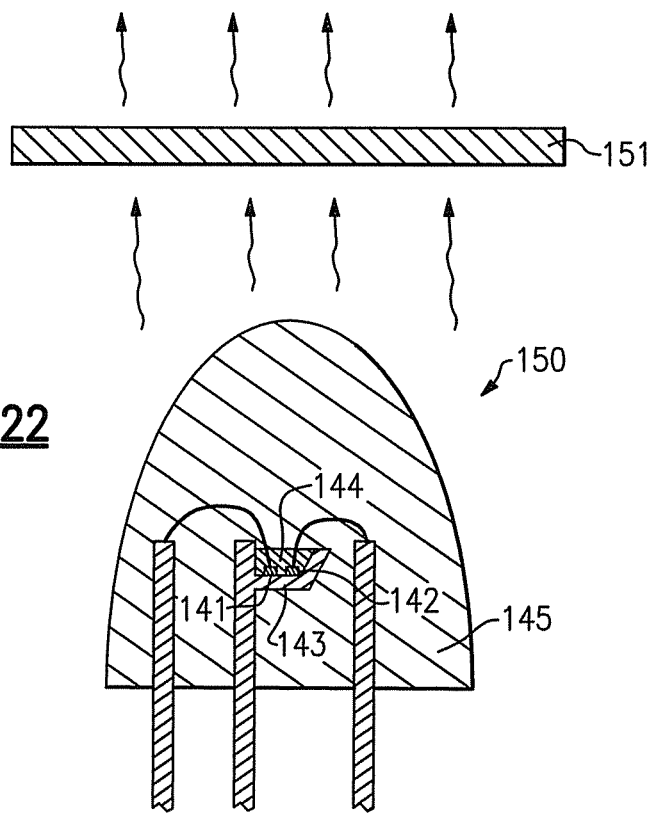

FIG. 22 depicts a representative embodiment of a light filter according to the present inventive subject matter.

Figure 23:
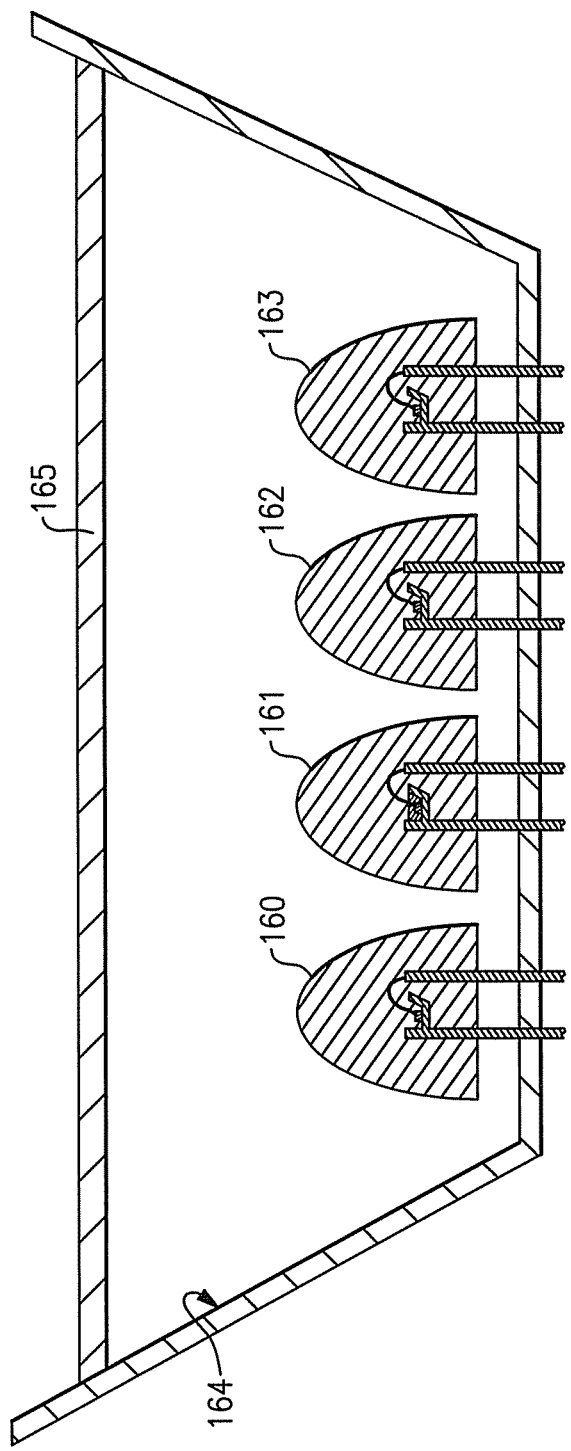

FIG. 23 depicts a representative embodiment of a light filter according to the present inventive subject matter.

Figure 24:
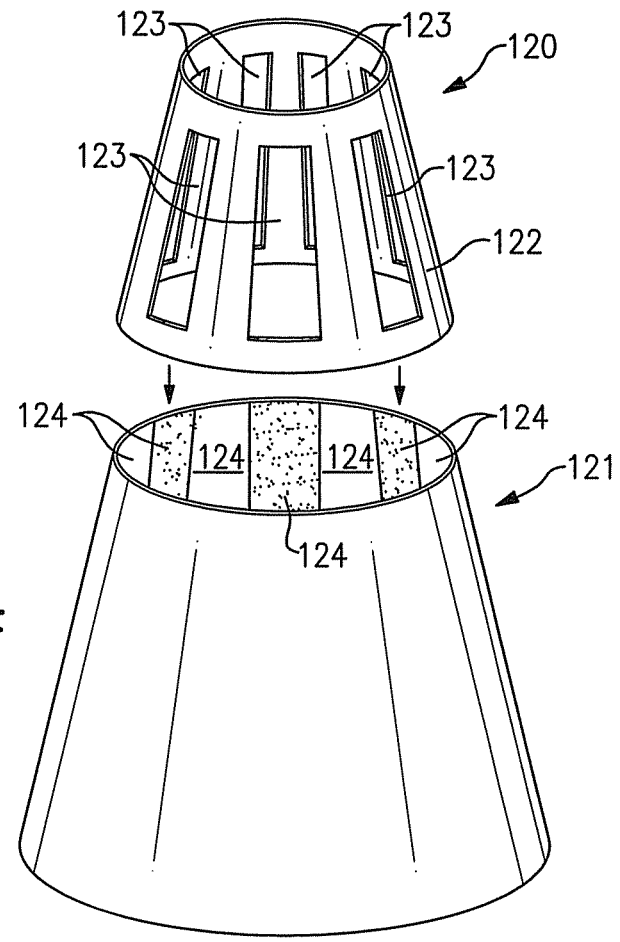

FIG. 24 depicts a representative embodiment of a light filter according to the present inventive subject matter.

Figure 25:
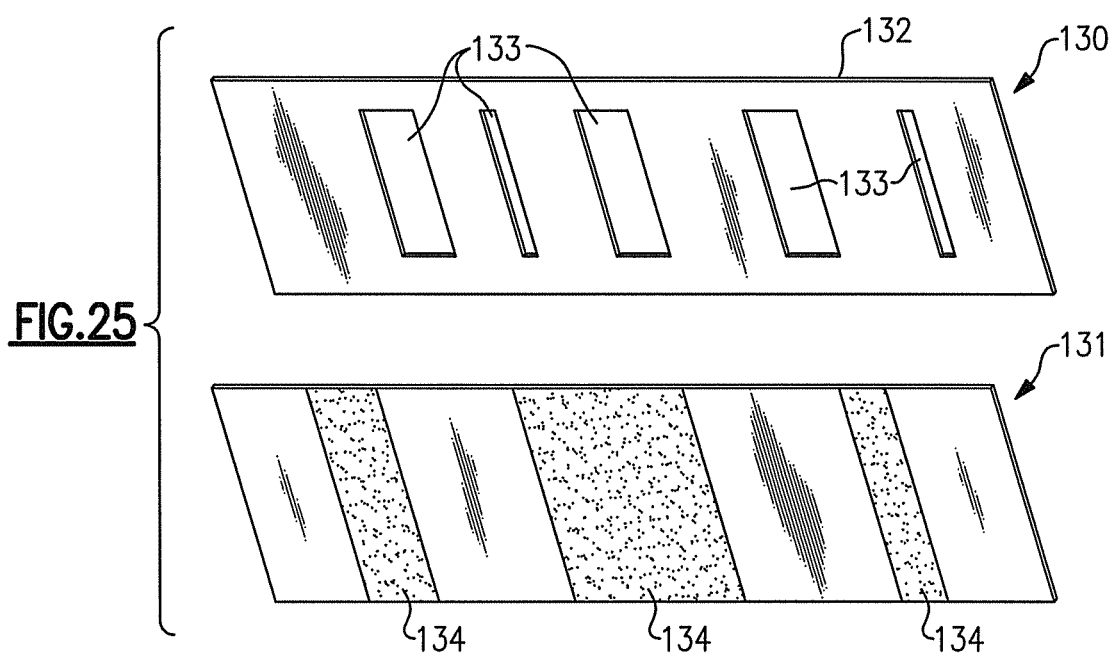

FIG. 25 depicts a representative embodiment of a light filter according to the present inventive subject matter.

DETAILED DESCRIPTION OF THE INVENTION(S)

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Furthermore, relative terms, such as "lower" or "bottom" and "upper" or "top," may be used herein to describe one element's relationship to another elements as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The expression "illumination" (or "illuminated"), as used herein when referring to a solid state light emitter, means that at least some current is being supplied to the solid state light emitter to cause the solid state light emitter to emit at least some light. The expression "illuminated" encompasses situations where the solid state light emitter emits light continuously or intermittently at a rate such that a human eye would perceive it as emitting light continuously, or where a plurality of solid state light emitters of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "excited", as used herein when referring to a lumiphor, means that at least some electromagnetic radiation (e.g., visible light, UV light or infrared light) is contacting the lumiphor, causing the lumiphor to emit at least some light. The expression "excited" encompasses situations where the lumiphor emits light continuously or intermittently at a rate such that a human eye would perceive it as emitting light continuously, or where a plurality of lumiphors of the same color or different colors are emitting light intermittently and/or alternatingly (with or without overlap in "on" times) in such a way that a human eye would perceive them as emitting light continuously (and, in cases where different colors are emitted, as a mixture of those colors).

The expression "lighting device", as used herein, is not limited, except that it indicates that the device is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

The expression "dominant wavelength", is used herein according to its well-known and accepted meaning to refer to the perceived color of a spectrum, i.e., the single wavelength of light which produces a color sensation most similar to the color sensation perceived from viewing light emitted by the light source (i.e., it is roughly akin to "hue"), as opposed to "peak wavelength", which is well-known to refer to the spectral line with the greatest power in the spectral power distribution of the light source. Because the human eye does not perceive all wavelengths equally (it perceives yellow and green better than red and blue), and because the light emitted by many solid state light emitter (e.g., LEDs) is actually a range of wavelengths, the color perceived (i.e., the dominant wavelength) is not necessarily equal to (and often differs from) the wavelength with the highest power (peak wavelength). A truly monochromatic light such as a laser has the same dominant and peak wavelengths.

A statement herein that two components in a device are "electrically connected," means that there are no components electrically between the components, the insertion of which materially affect the function or functions provided by the device. For example, two components can be referred to as being electrically connected, even though they may have a small resistor between them which does not materially affect the function or functions provided by the device (indeed, a wire connecting two components can be thought of as a small resistor); likewise, two components can be referred to as being electrically connected, even though they may have an additional electrical component between them which allows the device to perform an additional function, while not materially affecting the function or functions provided by a device which is identical except for not including the additional component; similarly, two components which are directly connected to each other, or which are directly connected to opposite ends of a wire or a trace on a circuit board or another medium, are electrically connected.

As used herein, the term "substantially" e.g., in the expressions "substantially coaxial", "substantially flat", "substantially cylindrical" or "substantially frustoconical", means at least about 95% correspondence with the feature recited, e.g.:

the expression "substantially flat" means that at least 95% of the points in the surface which is characterized as being substantially flat are located on one of or between a pair of planes which are parallel and which are spaced from each other by a distance of not more than 5% of the largest dimension of the surface;

the expression "substantially coaxial" means that the axes of the respective surfaces come to within a distance of not more than 5% of the largest dimension of the respective surfaces, and that the respective axes define an angle of not greater than 5 degrees;

the expression "substantially cylindrical", as used herein, means that at least 95% of the points in the surface which is characterized as being substantially cylindrical are located on one of or between a pair of imaginary cylindrical structures which are spaced from each other by a distance of not more than 5% of their largest dimension; and the expression "substantially frustoconical", as used herein, means that at least 95% of the points in the surface which is characterized as being substantially frustoconical are located on one of or between a pair of imaginary frustoconical structures which are spaced from each other by a distance of not more than 5% of their largest dimension.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 1:
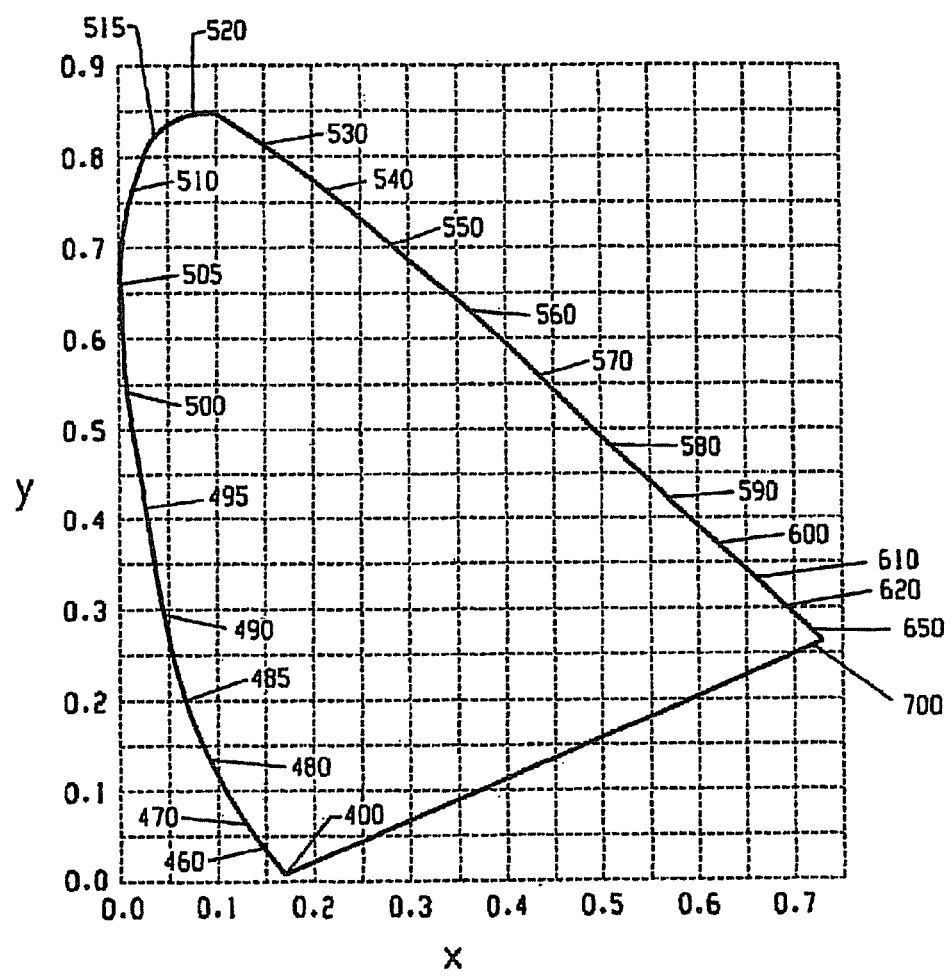
FIG. 1 shows the 1931 CIE Chromaticity Diagram.
Figure 2:
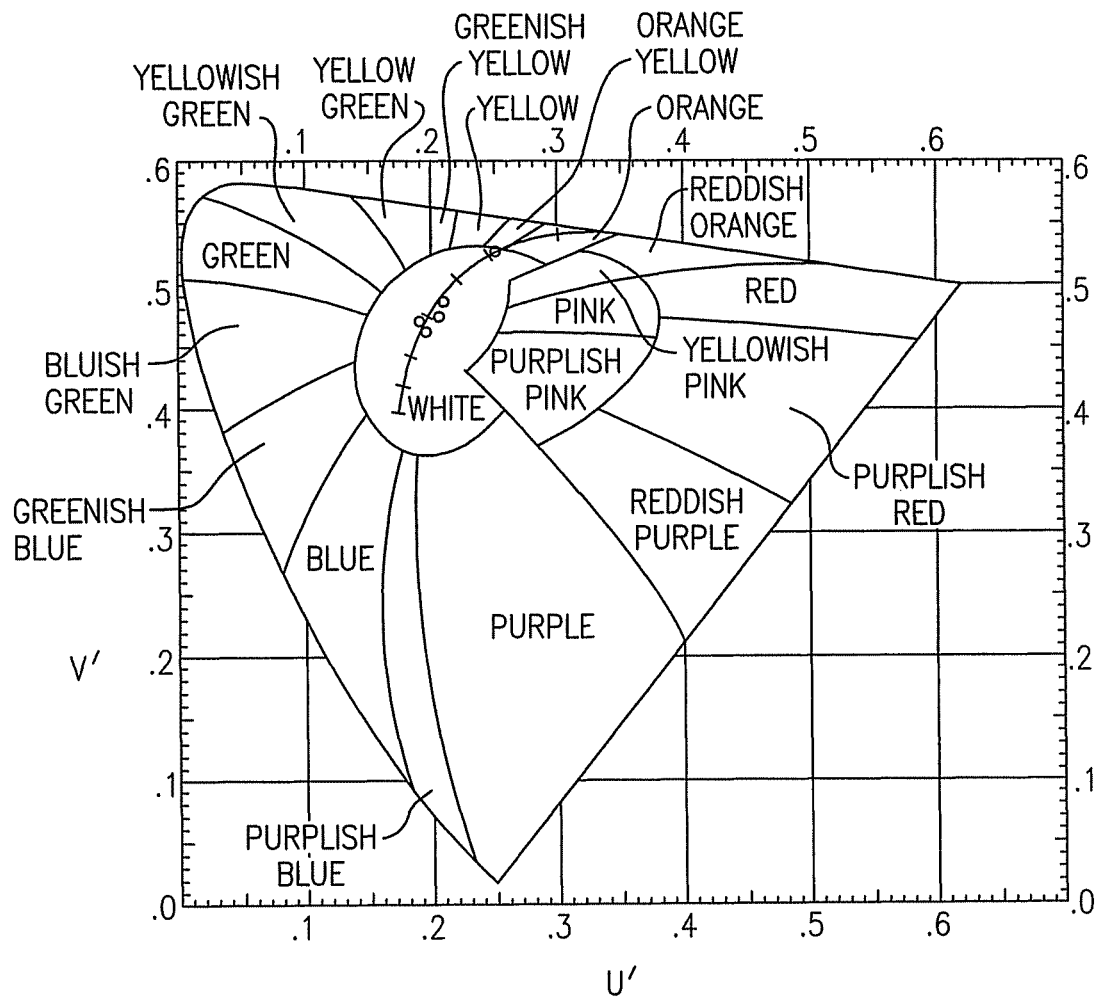
FIG. 2 shows the 1976 Chromaticity Diagram.
Figure 3:
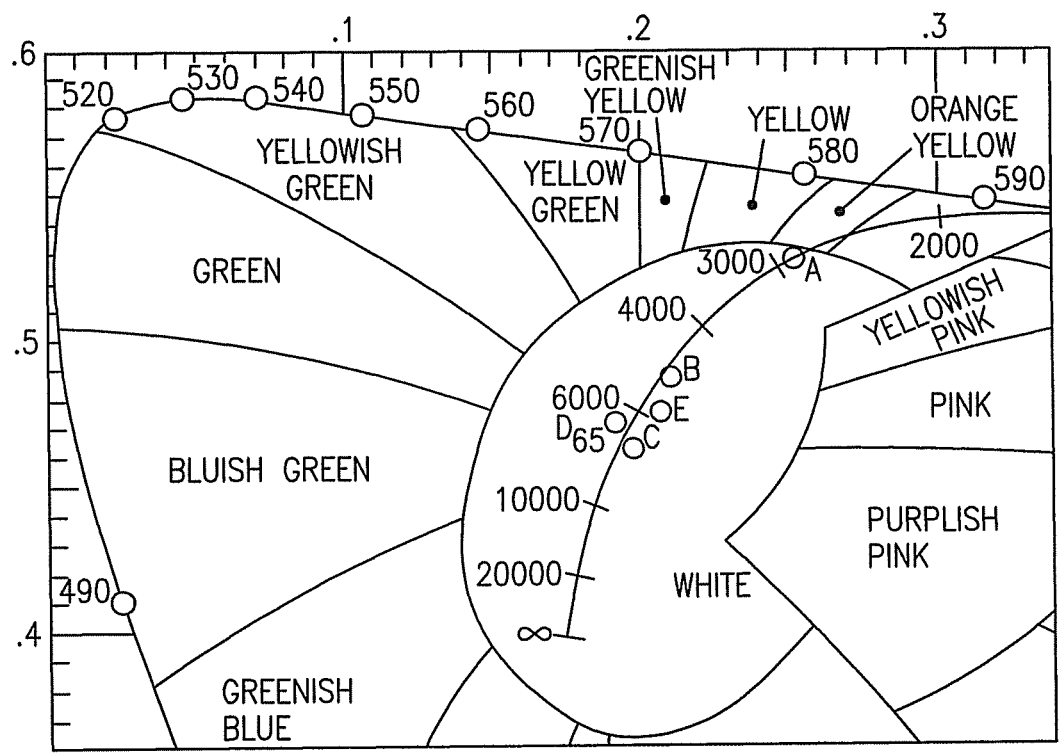
FIG. 3 shows an enlarged portion of the 1976 Chromaticity Diagram, in order to show the blackbody locus in detail.

All references to color herein (e.g., "white" light, "blue" light, etc.) refer to points on the 1976 CIE diagram as delineated in FIGS. 2 and 3 (and corresponding points on the 1931 CIE diagram).

In some embodiments according to the present inventive subject matter:

the lighting device further comprises a power line, the first light source and the second light source are electrically connected to the power line, and if current is supplied to the power line, a combination of (1) light exiting the lighting device which was emitted by the first light source and (2) light exiting the lighting device which was emitted by the second light source would, in an absence of any additional light, produce mixed light, the mixed light being white light. In some such embodiments, the mixed light has x, y coordinates on a 1931 CIE Chromaticity Diagram which define a point which is within ten MacAdam ellipses of at least one point on the blackbody locus on a 1931 CIE Chromaticity Diagram.

In some embodiments according to the present inventive subject matter:

the lighting device further comprises a power line, the first light source and the second light source are electrically connected to the power line, and if current is supplied to the power line, the lighting device would emit white light. In some such embodiments, the mixed light has x, y coordinates on a 1931 CIE Chromaticity Diagram which define a point which is within ten MacAdam ellipses of at least one point on the blackbody locus on a 1931 CIE Chromaticity Diagram.

In some embodiments according to the present inventive subject matter, the first light source comprises:

at least one first group light emitter, each of the first group light emitters, if activated, emitting light of a first color; and at least one second group light emitter, each of the second group light emitters, if activated, emitting light of a second color, the second color being different from the first color.

In some such embodiments, each of the first group light emitters comprises at least one first group solid state light emitter.

In some such embodiments, each of the first group light emitters comprises at least one first group solid state light emitter, and each of the first group light emitters comprises at least one first group LED.

In some such embodiments, each of the first group light emitters comprises at least one first group solid state light emitter, and each of the second group light emitters comprises at least one second group solid state light emitter.

In some such embodiments, each of the first group light emitters comprises at least one first group solid state light emitter, and each of the second group light emitters comprises at least one second group lumiphor.

In some of the embodiments described above, each of the first group light emitters comprises at least one solid state light emitter which, if illuminated, emits UV light; and the first light source further comprises at least one third group light emitter, each of the third group light emitters, if activated, emitting light of a third color, the third color being different from the first color and the second color, each of the third group light emitters comprising at least one third group lumiphor.

In some of the embodiments described above, the first light source further comprises at least one third group solid state light emitter.

In some of the embodiments described above:

each of the first group solid state light emitters, if excited, emits blue light;

each of the second group lumiphors, if excited, emits yellow light; and each of the third group solid state light emitters, if excited, emits red light.

In some of the embodiments described above, at least a first lumiphor of the second group of lumiphors is positioned such that if a first solid state light emitter of the first group of solid state light emitters is excited, a portion of light emitted from the first solid state light emitter is absorbed by the first lumiphor, thereby exciting the first lumiphor.

In some of the embodiments described above, the first light source comprises at least one packaged solid state light emitter, each packaged solid state light emitter comprising at least one first group solid state light emitter and at least one second group lumiphor.

In some of the embodiments described above:

the first group of light emitters comprises at least one solid state light emitter which, if illuminated, emits light having a peak wavelength in the range of from about 430 nm to about 480 nm; and the second group of light emitters comprises at least one lumiphor which, if illuminated, emits light having a dominant wavelength in the range of from about 555 nm to about 585 nm.

In some of the embodiments described above:

each of the first group light emitters comprises at least one first group lumiphor; and each of the second group light emitters comprises at least one second group lumiphor.

In some of the embodiments described above, the first light source further comprises at least one third group light emitter, each of the third group light emitters, if activated, emitting light of a third color, the third color being different from the first color and the second color.

In some of the embodiments described above:

each of the first group light emitters comprises at least one first group lumiphor;

each of the second group light emitters comprises at least one second group lumiphor; and each of the third group light emitters comprises at least one third group lumiphor.

In some of the embodiments described above:

each of the first group lumiphors, if excited, emits blue light;

each of the second group lumiphors, if excited, emits green light; and each of the third group lumiphors, if excited, emits red light.

In some of the embodiments described above:

each of the first group lumiphors, if excited, emits blue light;

each of the second group lumiphors, if excited, emits light of at least one color selected from among the group consisting of yellowish-green light, yellow-green light, greenish-yellow light and yellow light; and each of the third group lumiphors, if excited, emits red light.

In some of the embodiments described above:

each of the first group light emitters comprises at least one first group solid state light emitter;

each of the second group light emitters comprises at least one second group solid state light emitter; and each of the third group light emitters comprises at least one third group solid state light emitter.

In some of the embodiments described above:
    each of the first group solid state light emitters, if excited, emits blue light;
    each of the second group solid state light emitters, if excited, emits green light; and
    each of the third group solid state light emitters, if excited, emits red light.

In some of the embodiments described above:
    each of the first group solid state light emitters, if excited, emits blue light;
    each of the second group solid state light emitters, if excited, emits light of at least one color selected from among the group consisting of yellowish-green light, yellow-green light, greenish-yellow light and yellow light; and
    each of the third group solid state light emitters, if excited, emits red light.

In some embodiments according to the present inventive subject matter, the second light source comprises at least one solid state light emitter.

In some such embodiments, the second light source further comprises at least one lumiphor.

In some embodiments according to the present inventive subject matter, the second light source comprises at least one lumiphor.

In some embodiments according to the present inventive subject matter, the first filter, if contacted by the white light emitted from the first light source, would filter at least some blue light and at least some yellow light from the white light to form the modified light.

In some embodiments according to the present inventive subject matter, the first filter is a pass-through filter.

In some embodiments according to the present inventive subject matter, the first filter is a reflection filter.

In some embodiments according to the present inventive subject matter:
    the first filter comprises at least a first filter component and a second filter component,
    the first filter component comprising at least a first wall region, the first wall region comprising at least one window region,
    the second filter component comprising at least a first reflection region and a second reflection region,
        wherein the first reflection region, if contacted by a first mixture of light which is white, would reflect a first reflected light which differs in color from a second reflection light which would be reflected by the second reflection region if the second reflection region were contacted by the first mixture of light,
    at least one of the first filter component and the second filter component being movable such that differing portions of the first reflection region can be exposed through the window region, such that if the first mixture of light enters the filter, a color of light exiting the filter can be adjusted by adjusting a positional relationship between the first filter component and the second filter component.

In some such embodiments:
    an axis of the first filter component is substantially coaxial with an axis of the second filter component; and/or
    the first filter component and the second filter component each comprise regions which comprise at least a portion of a substantially frustoconical shape.

In some of the embodiments described above, the first filter component and the second filter component each comprise regions which are of substantially frustoconical shape.

In some of the embodiments described above, the first filter component and the second filter component each comprise regions which comprise at least a portion of a substantially cylindrical shape.

In some of the embodiments described above, the first filter component and the second filter component each comprise regions which are of substantially cylindrical shape.

In some embodiments according to the present inventive subject matter, the white light has a color temperature of at least 4,000 K, e.g., in the range of from about 4,000 K to about 50,000 K.

In some such embodiments:
    the lighting device further comprises a power line,
    the first light source and the second light source are electrically connected to the power line, and
    if current is supplied to the power line, a combination of (1) light exiting the lighting device which was emitted by the first light source and (2) light exiting the lighting device which was emitted by the second light source would, in an absence of any additional light, produce mixed light, the mixed light being white light having a color temperature which is lower than a color temperature of the white light.

In some embodiments according to the present inventive subject matter, the second light source, if illuminated, emits light having a dominant wavelength in the range of from about 600 nm to about 630 nm.

In some embodiments according to the present inventive subject matter, the first filter, if contacted by the white light emitted from the first light source, would filter at least 25%, on a mW basis, of the blue light from the white light to form the modified light.

In some embodiments according to the present inventive subject matter, the first filter, if contacted by the white light emitted from the first light source, would filter at least 25%, on a mW basis, of the blue light and at least 25%, on a mW basis, of green light from the white light to form the modified light.

As noted above, various aspects of the present inventive subject matter comprise one or more light sources which, if illuminated, emit white light. Persons of skill in the art are familiar with, and have ready access to, a wide variety of light sources which emit white light, and any such light sources can be employed in the present inventive subject matter.

For example, the following are descriptions of several methods (and apparatuses) of producing white light from LEDs and/or lumiphors:
    Combining two or more different mono-chromatic LEDs, such as a red LED, a green LED and a blue LED, in defined proportions, to produce white light. This method can also use two complementary colored lamps such as a bluish lamp combined with a yellowish lamp to produce white light;
    Combining one or more phosphors such as YAG:Ce with a blue LED, such that some of the blue emitted light is converted to yellow and/or red, and mixed with the remainder of unconverted blue light to make white light;
    Using a UV LED emitter combined with two or more phosphors, such that the UV light is converted into visible colors and combined to produce white light, for example either as a pair of complementary colors or a triad (or more) of primary colors combined to make white light; and
    Combinations of the devices described above and/or portions of those devices, e.g., combining one or more LEDs with a combined LED and phosphor, e.g., combining one or more red LEDs with a combination of a blue LED and a yellow phosphor (in which some blue light emitted by the blue LED is converted to yellow light by the yellow phosphor and mixes with the remaining blue light), to make white light.

Other ways of providing white light include combining a yellowish green highly unsaturated lamp (comprising a blue emitter and excess of yellow phosphor) with a red LED to produce white light, as described in:

(1) U.S. Patent Application No. 60/752,555, filed Dec. 21, 2005, entitled "LIGHTING DEVICE AND LIGHTING METHOD" (inventors: Antony Paul Van de Ven and Gerald H. Negley) and U.S. patent application Ser. No. 11/613,714, filed Dec. 20, 2006, the entireties of which are hereby incorporated by reference;

(2) U.S. Patent Application No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007, the entireties of which are hereby incorporated by reference;

(3) U.S. Patent Application No. 60/793,518, filed on Apr. 20, 2006, entitled "LIGHTING DEVICE AND LIGHTING METHOD" (inventors: Gerald H. Negley and Antony Paul van de Ven) and U.S. patent application Ser. No. 11/736,799, filed Apr. 18, 2007, the entireties of which are hereby incorporated by reference;

(4) U.S. Patent Application No. 60/857,305, filed on Nov. 7, 2006, entitled "LIGHTING DEVICE AND LIGHTING METHOD" (inventors: Antony Paul van de Ven and Gerald H. Negley; and U.S. patent application Ser. No. 11/936,163, filed Nov. 7, 2007, the entireties of which are hereby incorporated by reference;

(5) U.S. Patent Application No. 60/916,596, filed on May 8, 2007, entitled "LIGHTING DEVICE AND LIGHTING METHOD" (inventors: Antony Paul van de Ven and Gerald H. Negley), the entirety of which is hereby incorporated by reference;

(6) U.S. Patent Application No. 60/916,607, filed on May 8, 2007, entitled "LIGHTING DEVICE AND LIGHTING METHOD" (inventors: Antony Paul van de Ven and Gerald H. Negley), the entirety of which is hereby incorporated by reference;

(7) U.S. Patent Application No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007, the entireties of which are hereby incorporated by reference;

(8) U.S. Pat. No. 7,213,940, issued on May 8, 2007, entitled "LIGHTING DEVICE AND LIGHTING METHOD" (inventors: Antony Paul van de Ven and Gerald H, Negley), the entirety of which is hereby incorporated by reference;

(9) U.S. Patent Application No. 60/868,134, filed on Dec. 1, 2006, entitled "LIGHTING DEVICE AND LIGHTING METHOD" (inventors: Antony Paul van de Ven and Gerald H. Negley), the entirety of which is hereby incorporated by reference;

(10) U.S. patent application Ser. No. 11/948,021, filed on Nov. 30, 2007, entitled "LIGHTING DEVICE AND LIGHTING METHOD" (inventors: Antony Paul van de Ven and Gerald H. Negley), the entirety of which is hereby incorporated by reference;

(11) U.S. Patent Application No. 60/868,986, filed on Dec. 7, 2006, entitled "LIGHTING DEVICE AND LIGHTING METHOD" (inventors: Antony Paul van de Ven and Gerald H. Negley), and U.S. patent application Ser. No. 11/951,626, filed Dec. 6, 2007, the entireties of which are hereby incorporated by reference;

(12) U.S. Patent Application No. 60/916,597, filed on May 8, 2007, entitled "LIGHTING DEVICE AND LIGHTING METHOD" (inventors: Antony Paul van de Ven and Gerald H. Negley) and U.S. Patent Application No. 60/944,848, filed Jun. 19, 2007, the entireties of which are hereby incorporated by reference; and

(13) U.S. Patent Application No. 60/990,435, filed on Nov. 27, 2007, entitled "WARM WHITE ILLUMINATION WITH HIGH CRI AND HIGH EFFICACY" (inventors: Antony Paul van de Ven and Gerald H. Negley), the entirety of which is hereby incorporated by reference.

Although the present inventive subject matter is particularly concerned with white light sources which include one or more solid state light emitters and/or one or more lumiphors, the present inventive subject matter contemplates any kind of white light source, e.g., fluorescent lights and incandescent lights.

As noted above, various aspects of the present inventive subject matter comprise one or more filter which, if contacted by light, would filter at least some blue light from the light, i.e., if light which contains blue light is directed toward the filter, the light exiting the filter would differ from the light entering the filter in that some of the blue light contained in the light entering the filter would not be present in the light exiting the filter (i.e., the "filtered light"). Persons of skill in the art are familiar with, and have ready access to, a wide variety of such filters, and any such filters can be employed in the present inventive subject matter. Such filters include (1) pass-through filters, i.e., filters in which light to be filtered is directed toward the filter, and some or all of the light passes through the filter (e.g., some of the light does not pass through the filter) and the light which passes through the filter is the filtered light, (2) reflection filters, i.e., filters in which light to be filtered is directed toward the filter, and some or all of the light is reflected by the filter (e.g., some of the light is not reflected by the filter) and the light which is reflected by the filter is the filtered light, and (3) filters which provide a combination of both pass-through filtering and reflection filtering.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

FIGS. 4A-4C are plots of relative intensity of unfiltered light vs. wavelength, ratio of entering light which exits the filter vs. wavelength and relative intensity of filtered light vs. wavelength for an example where a yellowish-green light is created from a standard white lamp, a red lamp and a pale yellow filter. FIG. 4D is a 1931 CIE diagram showing the white light, the unfiltered light and the filtered light for this example. The x and y coordinates on the 1931 CIE diagram, the correlated color temperature (CCT), the percentage of milliwatts (that is, the percentage of the original optical power that remains, i.e., for unfiltered light, the value is 100% (none is filtered out), and for filtered light, the percentage is reduced by the percentage of the optical power which was removed by the filter), the CRI, the percentage of lumens (that is, the percentage of the original lumens that remains, i.e., for unfiltered light, the value is 100% (none is filtered out), and for filtered light, the percentage is reduced by the percentage of the lumens which was removed by the filter), and the lumens per watt are set forth in Table 1 below:

TABLE 1

|  | Unfiltered | Filtered |
| --- | --- | --- |
| 1931 CIE x coordinate | 0.326 | 0.374 |
| 1931 CIE y coordinate | 0.358 | 0.448 |
| CCT | 5757 | 4543 |
| % of mW | 100% | 84% |
| CRI | 68 | 61 |
| lumens | 100% | 98% |
| lumens/watt | 73 | 71 |

FIGS. 5A-5C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow filter. FIG. 5D is a 1931 CIE diagram showing the white light, the red light, the unfiltered light and the filtered light for this example. The x and y coordinates on the 1931 CIE diagram, the correlated color temperature (CCT), the percentage of milliwatts (defined as above), the CRI, the percentage of lumens (defined as above) and the lumens per watt are set forth in Table 2 below:

TABLE 2

|  | Unfiltered | Filtered |
| --- | --- | --- |
| 1931 CIE x coordinate | 0.402 | 0.454 |
| 1931 CIE y coordinate | 0.347 | 0.412 |
| CCT | 3139 | 2799 |
| % of mW | 100% | 89% |
| CRI | 85 | 90 |
| lumens | 100% | 98% |
| lumens/watt | 66 | 65 |

FIGS. 6A-6C are plots of relative intensity of unfiltered light vs. wavelength, ratio of entering light which exits the filter vs. wavelength and relative intensity of filtered light vs, wavelength for an example where a warm white light is created from a standard white lamp, a red lamp and a pale yellow stepped low pass filter. FIG. 6D is a 1931 CIE diagram showing the white light, the unfiltered light and the filtered light for this example. The x and y coordinates on the 1931 CIE diagram, the correlated color temperature (CCT), the percentage of milliwatts (defined as above), the CRI, the percentage of lumens (defined as above) and the lumens per watt are set forth in Table 3 below:

TABLE 3

|  | Unfiltered | Filtered |
| --- | --- | --- |
| 1931 CIE x coordinate | 0.411 | 0.463 |
| 1931 CIE y coordinate | 0.348 | 0.412 |
| CCT | 2953 | 2670 |
| % of mW | 100% | 89% |

TABLE 3-continued

|  | Unfiltered | Filtered |
| --- | --- | --- |
| CRI | 89 | 93 |
| lumens | 100% | 99% |
| lumens/watt | 68 | 67 |
| dC (i.e., distance from the blackbody locus on the 1931 CIE chart) | 0.00207 | 0.00002 |

FIGS. 7A-7C are plots of relative intensity of unfiltered light vs. wavelength, ratio of entering light which exits the filter vs. wavelength and relative intensity of filtered light vs. wavelength for an example where a warn white light is created from a standard white lamp, a red lamp and a pale yellow notch filter. FIG. 7D is a 1931 CIE diagram showing the white light, the red light, the unfiltered light and the filtered light for this example. The x and y coordinates on the 1931 CIE diagram, the correlated color temperature (CCT), the percentage of milliwatts (defined as above), the CRI, the percentage of lumens (defined as above) and the lumens per watt are set forth in Table 4 below:

TABLE 4

|  | Unfiltered | Filtered |
| --- | --- | --- |
| 1931 CIE x coordinate | 0.411 | 0.454 |
| 1931 CIE y coordinate | 0.348 | 0.401 |
| CCT | 2953 | 2701 |
| % of mW | 100% | 91% |
| CRI | 89 | 92 |
| lumens | 100% | 99% |
| lumens/watt | 68 | 67 |
| dC (defined as above) | 0.00207 | 0.0003 |

FIGS. 8A-8C are plots of relative intensity of unfiltered light vs. wavelength, ratio of entering light which exits the filter vs. wavelength and relative intensity of filtered light vs wavelength for an example where a warm white light is created from a standard white lamp, a red lamp and a pale yellow bandpass filter. FIG. 8D is a 1931 CIE diagram showing the white light, the red light, the unfiltered light and the filtered light for this example. The x and y coordinates on the 1931 CIE diagram, the correlated color temperature (CCT), the percentage of milliwatts (defined as above), the CRI, the percentage of lumens (defined as above) and the lumens per watt are set forth in Table 5 below:

TABLE 5

|  | Unfiltered | Filtered |
| --- | --- | --- |
| 1931 CIE x coordinate | 0.411 | 0.454 |
| 1931 CIE y coordinate | 0.348 | 0.409 |
| CCT | 2953 | 2764 |
| % of mW | 100% | 81% |
| CRI | 89 | 92 |
| lumens | 100% | 94% |
| lumens/watt | 68 | 63 |
| dC (defined as above) | 0.00207 | 0.00009 |

FIGS. 9A-9C are plots of relative intensity of unfiltered light vs. wavelength, ratio of entering light which exits the filter vs. wavelength and relative intensity of filtered light vs. wavelength for an example where a warm white light is created from a standard white lamp, a red lamp and a pale yellow lowpass filter. FIG. 9D is a 1931 CIE diagram showing the white light, the red light, the unfiltered light and the filtered light for this example. The x and y coordinates on the 1931

CIE diagram, the correlated color temperature (CCT), the percentage of milliwatts (defined as above), the CRI, the percentage of lumens (defined as above) and the lumens per watt are set forth in Table 6 below:

TABLE 6

|  | Unfiltered | Filtered |
|---|---|---|
| 1931 CIE x coordinate | 0.326 | 0.461 |
| 1931 CIE y coordinate | 0.358 | 0.410 |
| CCT | 5757 | 2688 |
| % of mW | 100% | 38% |
| CRI | 67 | 85 |
| lumens | 100% | 36% |
| lumens/watt | 73 | 26 |
| dC (defined as above) | 0.0008 | 0.00015 |

The filters employed in the present inventive subject matter can also comprise structures which include portions which filter light and portions which do not filter light (e.g., transparent portions).

As noted above, various aspects of the present inventive subject matter comprise one or more light sources which, if illuminated, emit light of at least one color, e.g., selected from among the group consisting of red light and reddish-orange light. Persons of skill in the art are familiar with, and have ready access to, a wide variety of such light sources, and any such light sources can be employed in the present inventive subject matter. For example, such light sources can comprise one or more LEDs, one or more lumiphors and/or combinations thereof.

As noted above, various embodiments of the present inventive subject matter comprise one or more solid state light emitters. Persons of skill in the art are familiar with, and have ready access to, a wide variety of such solid state light emitters, and any such solid state light emitters can be employed in the present inventive subject matter. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well-known in the art (and therefore it is not necessary to describe in detail such devices, and/or the materials out of which such devices are made).

The respective light emitters can be similar to one another, different from one another or any combination (i.e., there can be a plurality of solid state light emitters of one type, or one or more solid state light emitters of each of two or more types)

For example, one type of solid state light emitter is a light emitting diode.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

For example, light emitting diodes and LEDs (as well as lumiphors) which may be used in practicing the present inventive subject matter are described in:

(1) U.S. Patent Application No. 60/753,138, filed on Dec. 22, 2005, entitled "LIGHTING DEVICE" (inventor: Gerald H. Negley) and U.S. patent application Ser. No. 11/614,180, filed Dec. 21, 2006, the entireties of which are hereby incorporated by reference;

(2) U.S. Patent Application No. 60/794,379, filed on Apr. 24, 2006, entitled "SHIFTING SPECTRAL CONTENT IN LEDS BY SPATIALLY SEPARATING LUMIPHOR FILMS" (inventors: Gerald H. Negley and Antony Paul van de Ven) and U.S. patent application Ser. No. 11/624,811, filed Jan. 19, 2007, the entireties of which are hereby incorporated by reference;

(3) U.S. Patent Application No. 60/808,702, filed on May 26, 2006, entitled "LIGHTING DEVICE" (inventors: Gerald H. Negley and Antony Paul van de Ven) and U.S. patent application Ser. No. 11/751,982, filed May 22, 2007, the entireties of which are hereby incorporated by reference;

(4) U.S. Patent Application No. 60/808,925, filed on May 26, 2006, entitled "SOLID STATE LIGHT EMITTING DEVICE AND METHOD OF MAKING SAME" (inventors: Gerald H. Negley and Neal Hunter) and U.S. patent application Ser. No. 11/753,103, filed May 24, 2007, the entireties of which are hereby incorporated by reference;

(5) U.S. Patent Application No. 60/802,697, filed on May 23, 2006, entitled "LIGHTING DEVICE AND METHOD OF MAKING" (inventor: Gerald H. Negley) and U.S. patent application Ser. No. 11/751,990, filed May 22, 2007, the entireties of which are hereby incorporated by reference;

(6) U.S. Patent Application No. 60/793,524, filed on Apr. 20, 2006, entitled "LIGHTING DEVICE AND LIGHTING METHOD" (inventors: Gerald H. Negley and Antony Paul van de Ven) and U.S. patent application Ser. No. 11/736,761, filed Apr. 18, 2007, the entireties of which are hereby incorporated by reference;

(7) U.S. Patent Application No. 60/839,453, filed on Aug. 23, 2006, entitled "LIGHTING DEVICE AND LIGHTING METHOD" (inventors: Antony Paul van de Ven and Gerald H. Negley) and U.S. patent application Ser. No. 11/843,243, filed Aug. 22, 2007, the entireties of which are hereby incorporated by reference;

(8) U.S. Patent Application No. 60/851,230, filed on Oct. 12, 2006, entitled "LIGHTING DEVICE AND METHOD OF MAKING SAME" (inventor: Gerald H. Negley) and U.S. patent application Ser. No. 11/870,679, filed Oct. 11, 2007, the entireties of which are hereby incorporated by reference;

(9) U.S. Patent Application No. 60/916,608, filed on May 8, 2007, entitled "LIGHTING DEVICE AND LIGHTING METHOD" (inventors: Antony Paul van de Ven and Gerald H. Negley), the entirety of which is hereby incorporated by reference; and

(10) U.S. Patent Application No. 60/982,900, filed on Oct. 26, 2007, entitled "ILLUMINATION DEVICE HAVING ONE OR MORE LUMIPHORS, AND METHODS OF FABRICATING SAME" (inventors: Gerald H. Negley and Antony Paul van de Ven), the entirety of which is hereby incorporated by reference.

As noted above, various embodiments of the present inventive subject matter comprise one or more lumiphors. Persons of skill in the art are familiar with, and have ready access to, a wide variety of such lumiphors, and any such lumiphors can be employed in the present inventive subject matter.

A wide variety of lumiphors (also known as luminescent materials or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being downconverting, i.e., a material which converts photons to a lower energy level (longer wavelength) or up-converting, i.e., a material which converts photons to a higher energy level (shorter wavelength).

Inclusion of luminescent materials in LED devices has been accomplished in a variety of ways, one representative way being by adding the luminescent materials to a clear encapsulant material (e.g., epoxy-based, silicone-based, glass-based or metal oxide-based material) as discussed above, for example by a blending or coating process.

For example, one representative example of a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. A luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

The lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter. The lighting devices of the present inventive subject matter can be electrically connected (or selectively connected) to any desired power source, persons of skill in the art being familiar with a variety of such power sources, Devices and methods according to the present inventive subject matter can employ any desired arrangements of lighting devices, schemes for mounting lighting devices, apparatus for supplying electricity to lighting devices, housings for lighting devices, fixtures for lighting devices, other mounting structures, complete lighting assemblies, and power supplies for lighting devices. Representative examples of arrangements of lighting devices, schemes for mounting lighting devices, apparatus for supplying electricity to lighting devices, housings for lighting devices, fixtures for lighting devices, other mounting structures, complete lighting assemblies, and power supplies for lighting devices, all of which are suitable for the lighting devices of the present inventive subject matter, are described in:

(1) U.S. Patent Application No. 60/752,753, filed on Dec. 21, 2005, entitled "LIGHTING DEVICE" (inventors: Gerald H. Negley, Antony Paul van de Ven and Neal Hunter) and U.S. patent application Ser. No. 11/613,692, filed Dec. 20, 2006, the entireties of which are hereby incorporated by reference;

(2) U.S. Patent Application No. 60/798,446, filed on May 5, 2006, entitled "LIGHTING DEVICE" (inventor: Antony Paul van de Ven) and U.S. patent application Ser. No. 11/743,754, filed May 3, 2007, the entireties of which are hereby incorporated by reference;

(3) U.S. Patent Application No. 60/809,618, filed on May 31, 2006, entitled "LIGHTING DEVICE AND METHOD OF LIGHTING" (inventors: Gerald H. Negley, Antony Paul van de Ven and Thomas G. Coleman) and U.S. patent application Ser. No. 11/755,153, filed May 30, 2007, the entireties of which are hereby incorporated by reference;

(4) U.S. Patent Application No. 60/845,429, filed on Sep. 18, 2006, entitled "LIGHTING DEVICES, LIGHTING ASSEMBLIES, FIXTURES AND METHODS OF USING SAME" (inventor: Antony Paul van de Ven), and U.S. patent application Ser. No. 11/856,421, filed Sep. 17, 2007, the entireties of which are hereby incorporated by reference;

(5) U.S. Patent Application No. 60/846,222, filed on Sep. 21, 2006, entitled "LIGHTING ASSEMBLIES, METHODS OF INSTALLING SAME, AND METHODS OF REPLACING LIGHTS" (inventors: Antony Paul van de Ven and Gerald H. Negley), and U.S. patent application Ser. No. 11/859,048, filed Sep. 21, 2007, the entireties of which are hereby incorporated by reference;

(6) U.S. Patent Application No. 60/858,558, filed on Nov. 13, 2006, entitled "LIGHTING DEVICE, ILLUMINATED ENCLOSURE AND LIGHTING METHODS" (inventor: Gerald H. Negley) and U.S. patent application Ser. No. 11/939,047, filed Nov. 13, 2007, the entireties of which are hereby incorporated by reference;

(7) U.S. Patent Application No. 60/858,881, filed on Nov. 14, 2006, entitled "LIGHT ENGINE ASSEMBLIES" (inventors: Paul Kenneth Pickard and Gary David Trott) and U.S. patent application Ser. No. 11/939,052, filed Nov. 13, 2007, the entireties of which are hereby incorporated by reference;

(8) U.S. Patent Application No. 60/859,013, filed on Nov. 14, 2006, entitled "LIGHTING ASSEMBLIES AND COMPONENTS FOR LIGHTING ASSEMBLIES" (inventors: Gary David Trott and Paul Kenneth Pickard) and U.S. patent application Ser. No. 11/736,799, filed Apr. 18, 2007, the entireties of which are hereby incorporated by reference;

(9) U.S. Patent Application No. 60/853,589, filed on Oct. 23, 2006, entitled "LIGHTING DEVICES AND METHODS OF INSTALLING LIGHT ENGINE HOUSINGS AND/OR TRIM ELEMENTS IN LIGHTING DEVICE HOUSINGS" (inventors: Gary David Trott and Paul Kenneth Pickard) and U.S. patent application Ser. No. 11/877,038, filed Oct. 23, 2007, the entireties of which are hereby incorporated by reference;

(10) U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference;

(11) U.S. Patent Application No. 60/916,384, filed on May 7, 2007, entitled "LIGHT FIXTURES, LIGHTING DEVICES, AND COMPONENTS FOR THE SAME" (inventors: Paul Kenneth Pickard, Gary David Trott and Ed Adams), and U.S. patent application Ser. No. 11/948,041, filed Nov. 30, 2007 (inventors: Gary David Trott, Paul Kenneth Pickard and Ed Adams), the entireties of which are hereby incorporated by reference;

(12) U.S. Patent Application No. 60/916,030, filed on May 4, 2007, entitled "LIGHTING FIXTURE" (inventors: "Paul Kenneth Pickard, James Michael LAY and Gary David Trott), the entirety of which is hereby incorporated by reference; and

(13) U.S. Patent Application No. 60/916,407, filed on May 7, 2007, entitled "LIGHT FIXTURES AND LIGHTING DEVICES" (inventors: Gary David Trott and Paul Kenneth Pickard), the entirety of which is hereby incorporated by reference.

The lighting devices of the present inventive subject matter can be supplied with electricity in any desired manner. Skilled artisans are familiar with a wide variety of power supplying apparatuses, and any such apparatuses can be employed in connection with the present inventive subject matter. The lighting devices of the present inventive subject matter can be electrically connected (or selectively connected) to any desired power source, persons of skill in the art being familiar with a variety of such power sources.

In addition, any desired circuitry can be employed in order to supply energy to the lighting devices according to the present inventive subject matter. Representative examples of circuitry which may be used in practicing the present inventive subject matter is described in:

(1) U.S. Patent Application No. 60/809,959, filed on Jun. 1, 2006, entitled "LIGHTING DEVICE WITH COOLING" (inventors: Thomas G. Coleman, Gerald H. Negley and Antony Paul van de Ven) and U.S. patent application Ser. No. 11/626,483, filed Jan. 24, 2007, the entireties of which are hereby incorporated by reference;

(2) U.S. Patent Application No. 60/809,595, filed on May 31, 2006, entitled "LIGHTING DEVICE AND METHOD OF LIGHTING" (inventor: Gerald H. Negley) and U.S. patent application Ser. No. 11/755,162, filed May 30, 2007, the entireties of which are hereby incorporated by reference;

(3) U.S. Patent Application No. 60/844,325, filed on Sep. 13, 2006, entitled "BOOST/FLYBACK POWER SUPPLY TOPOLOGY WITH LOW SIDE MOSFET CURRENT CONTROL" (inventor: Peter Jay Myers), and U.S. patent application Ser. No. 11/854,744, filed Sep. 13, 2007, entitled "CIRCUITRY FOR SUPPLYING ELECTRICAL POWER TO LOADS", the entireties of which are hereby incorporated by reference;

(4) U.S. Patent Application No. 60/943,910, filed on Jun. 14, 2007, entitled "DEVICES AND METHODS FOR POWER CONVERSION FOR LIGHTING DEVICES WHICH INCLUDE SOLID STATE LIGHT EMITTERS" (inventor: Peter Jay Myers);

(5) U.S. patent application Ser. No. 12/017,558, filed on Jan. 22, 2008, entitled "FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS" (inventors: Gerald H. Negley and Antony Paul van de Ven), U.S. Patent Application No. 60/885,937, filed on Jan. 22, 2007, entitled "HIGH VOLTAGE SOLID STATE LIGHT EMITTER" (inventor: Gerald H. Negley), U.S. Patent Application No. 60/982,892, filed on Oct. 26, 2007, entitled "FAULT TOLERANT LIGHT EMITTERS, SYSTEMS INCORPORATING FAULT TOLERANT LIGHT EMITTERS AND METHODS OF FABRICATING FAULT TOLERANT LIGHT EMITTERS" (inventors: Gerald H. Negley and Antony Paul van de Ven), and U.S. Patent Application No. 60/986,662, filed on Nov. 9, 2007), the entireties of which are hereby incorporated by reference;

(6) U.S. patent application Ser. No. 12/017,600, filed on Jan. 22, 2008, entitled "ILLUMINATION DEVICES USING EXTERNALLY INTERCONNECTED ARRAYS OF LIGHT EMITTING DEVICES, AND METHODS OF FABRICATING SAME" (inventors: Gerald H. Negley and Antony Paul van de Ven), U.S. Patent Application No. 60/982,909, filed on Oct. 26, 2007 (inventors: Gerald H. Negley and Antony Paul van de Ven) and U.S. Patent Application No. 60/986,795, filed Nov. 9, 2007), the entireties of which are hereby incorporated by reference; and (7) U.S. patent application Ser. No. 12/017,676, filed on Jan. 22, 2008, entitled "ILLUMINATION DEVICE HAVING ONE OR MORE LUMIPHORS, AND METHODS OF FABRICATING SAME" (inventors: Gerald H. Negley and Antony Paul van de Ven), U.S. Patent Application No. 60/982,900, filed on Oct. 26, 2007 (inventors: Gerald H. Negley and Antony Paul van de Ven), the entirety of which is hereby incorporated by reference.

Using Excel® and simulated and measured spectrums of white, yellowish-green and red LEDs (or LED lamps), combined, various filter types were simulated to check the overall efficacy of the systems. Using a low pass filter with a slope starting at 500 nm and decreasing to zero at 400 nm, it was observed that the theoretical loss in lumens was estimated to be only about 5%, while the CRI Ra improvement over the standard white LED lamp was estimated to be almost 20 points from about 70 to about 90.

In a representative embodiment of the present inventive subject matter, light from a standard white LED lamp with a color temperature between 5000 and 10000 K is filtered through a yellowish filter to remove about 50% (on a mW basis) of the blue component to make a yellowish-green lamp.

In another representative embodiment of the present inventive subject matter, a more lossy filter is used to color convert a standard white LED lamp to a warmer (lower) cct (correlated color temperature) and improve the CRI Ra. This involves attenuating the blue by 80% (on a mW basis) and approximately 60% (on a mW basis) attenuation of the green portion of the spectrum.

Another representative embodiment of a lighting device according to the present inventive subject matter is depicted in FIG. 10. Referring to FIG. 10, the lighting device comprises an LED 10, an LED lamp 11 and a pale yellow filter 12. In this embodiment, the LED 10 emits red light, the LED lamp 11 emits white light, the red light and the white light mix to produce pink light, the pink light passes through the filter 12, resulting in warm white light exiting the filter 12.

Another representative embodiment of a lighting device according to the present inventive subject matter is depicted in FIG. 11. Referring to FIG. 11, the lighting device comprises a white LED lamp 20 and a filter 21. The filter 21 comprises a transparent substrate which is interspersed and/or coated with yellow filter areas 22. In this embodiment, the LED lamp 20 emits white light which passes through the filter to provide modified light. If desired, the modified light can be combined with additional light (e.g., red light to produce white light of improved CRI Ra relative to the white light from the LED lamp 20).

Another representative embodiment of a lighting device according to the present inventive subject matter is depicted in FIG. 12. Referring to FIG. 12, the lighting device comprises a white LED lamp 30 and a reflective surface 31. The reflective surface 31 attenuates in a blue spectrum portion. White light is emitted from the LED lamp 30, contacts the reflective surface 31, and modified light is reflected from the reflective surface. If desired, the modified light can be combined with additional light (e.g., red light to produce white light of improved CRI Ra relative to the white light from the LED lamp 30).

Another representative embodiment of a lighting device according to the present inventive subject matter is depicted in FIG. 13. Referring to FIG. 13, the lighting device comprises a packaged white LED lamp 40 which includes an LED chip 41, an encapsulant 42 and a filter 43 positioned within the encapsulant 42.

Another representative embodiment of a lighting device according to the present inventive subject matter is depicted in FIG. 14. Referring to FIG. 14, the lighting device comprises a packaged white LED lamp 50 which includes an LED chip 51, an encapsulant 52 and a filter 53 positioned on a surface of the encapsulant 52.

Another representative embodiment of a lighting device according to the present inventive subject matter is depicted in FIG. 15. Referring to FIG. 15, the lighting device comprises a packaged white LED lamp 60 which includes an LED chip 61, an encapsulant 62, a reflector 63 and a filter 64 positioned on the reflector 63.

Another representative embodiment of a lighting device according to the present inventive subject matter is depicted in FIG. 16. Referring to FIG. 16, the lighting device comprises an array of red LEDs 70 and white LED lamps 71, a reflector 74 and a changeable filter 75. The filter 75 can be changed among different yellowish filters in order to change the color temperature and/or the CRI Ra of the exiting light.

Another representative embodiment of a lighting device according to the present inventive subject matter is depicted in FIG. 17. Referring to FIG. 17, the lighting device comprises an LED lamp 80, an LED 81 and a filter 82. In this embodiment, the LED lamp 80 emits white light and the LED 81 emits red light. The white light emitted from the LED lamp 80 passes through the filter 82 and modified light exits from the filter 82. The modified light mixes with the red light (at least part of which does not contact the filter) from the LED 81.

Another representative embodiment of a lighting device according to the present inventive subject matter is depicted in FIG. 18. Referring to FIG. 18, the lighting device comprises an LED lamp 90, an LED 91 and a filter 92. In this embodiment, the LED lamp 90 emits white light and the LED 91 emits red light. The white light and the red light mix to produce mixed light, which then passes through the filter 92 (i.e., at least some of the white light that enters the filter exits from the filter), and filtered mixed light exits from the filter 92 (and/or the white light and the red light pass through the filter 92 and are then mixed).

Another representative embodiment of a lighting device according to the present inventive subject matter is depicted in FIG. 19. Referring to FIG. 19, the lighting device comprises an LED lamp 100 and a filter 101. In this embodiment, the filter 101 includes light filtering material dispersed in a substrate. Light emitted by the LED lamp 100 passes through the filter 101 and filtered light exits from the filter 101.

Another representative embodiment of a lighting device according to the present inventive subject matter is depicted in FIG. 20. Referring to FIG. 20, the lighting device comprises an LED lamp 110 and a filter 111. In this embodiment, the filter 111 includes transmissive light filtering material on one or both surfaces of a substrate. Light emitted by the LED lamp 110 passes through the filter 111 and filtered light exits from the filter 111.

Another representative embodiment of a lighting device according to the present inventive subject matter is depicted in FIG. 21. Referring to FIG. 21, the lighting device comprises an LED lamp 140 which includes a blue light emitting diode chip 141 and a red light emitting diode chip 142 mounted in a reflector cup 143, a phosphor 144, an encapsulant 145 and a filter 146 positioned within the encapsulant 145. Alternatively, the filter could be positioned in any other suitable location, e.g., on a surface of the encapsulant (as in the embodiment depicted in FIG. 14) or as a separate structure as depicted in FIG. 22, discussed below.

Another representative embodiment of a lighting device according to the present inventive subject matter is depicted in FIG. 22. Referring to FIG. 22, the lighting device comprises an LED lamp 150 and a filter 151. The LED lamp includes a blue light emitting diode chip 141 and a red light emitting diode chip 142 mounted in a reflector cup 143, a phosphor 144, and an encapsulant 145. Alternatively, the filter could be positioned in any other suitable location, e.g., on a surface of the encapsulant (as in the embodiment depicted in FIG. 14) or as a separate structure as depicted in FIG. 22, discussed below.

Another representative embodiment of a lighting device according to the present inventive subject matter is depicted in FIG. 23. Referring to FIG. 23, the lighting device comprises an array of one or more red LED(s) 160, one or more white LED lamp(s) 161, one or more green LED(s) 162, one or more blue LED(s) 163, a reflector 164 and a filter 165.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

The present inventive subject matter is further directed to an illuminated surface, comprising a surface and at least one lighting device as described herein, wherein if the lighting device is illuminated, the lighting device would illuminate at least a portion of the surface.

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

As noted above, various aspects of the present inventive subject matter relate to a light filter, comprising at least a first filter component and a second filter component. Such light filters can include additional filter components.

The filter components can be of any desired size and shape, a variety of which can readily be envisioned and made by those skilled in the art.

FIG. 24 depicts a representative embodiment of such a light filter. The embodiment shown in FIG. 24 includes a first filter component 120 and a second filter component 121. In FIG. 24, the first filter component 120 is shown separate from the second filter component 121. In use, the first filter component 120 would be positioned inside the second filter component and light would enter one of the openings at the top or bottom of the device.

The first filter component 120 comprises a first wall region 122 which includes a plurality of window regions 123. The second filter component comprises a plurality of reflection regions 124. At least one of the reflection regions 124, if contacted by a light from a white light source, would reflect light which differs in color from what would be reflected by at least one other of the reflection regions 124 if contacted by light from the same white light source.

By shaping the window regions 123 and the reflection regions 124 as desired, and by selecting reflection regions 124 which reflect desired colors, the light filter can be designed to filter a desired proportion (or proportions) of one or more selected colors. In addition, by so 110 shaping the window regions 123 and the reflection regions 124 as desired, and by selecting reflection regions 124 which reflect desired colors, the light filter can be designed to be adjusted by adjusting the position of the first filter component 120 relative to the second filter, component 121 so that the colors which are filtered, and the degree of attenuation of all such colors, can be selected by appropriate positioning of the first filter component relative to the second filter component, e.g., by rotating one of the filter components about its axis and (1) holding the other filter component in place, (2) rotating the other filter component in an opposite direction and/or (3) rotating the other filter component in the same direction but to a lesser, extent.

As noted above, the filter components can be of any desired shape. In the embodiment depicted in FIG. 24, the filter, components are substantially frustoconical. Alternatively, the filter components could be any desired shape, e.g., cylindrical (or any other shapes which are symmetrical about an axis), comb-shaped, polygonal (i.e., such that a plane drawn perpendicular to their axes would intersect with them along a polygon) or substantially flat. In addition, one or both of the filter components could consist of only a portion of such a shape, e.g., the filter, components could each be the shape of a portion of a cylinder.

For example, FIG. 25 depicts another representative embodiment of such a light filter, The embodiment shown in FIG. 25 includes a first filter component 130 and a second filter component 131. In FIG. 25, the first filter component 130 is shown separate from the second filter component 131. In use, the first filter component 130 would be positioned in contact with the second filter component 131.

The first filter component 130 comprises a first wall region 132 which includes a plurality of window regions 133. The second filter component comprises a plurality of reflection regions 134. At least one of the reflection regions 134, if contacted by a light from a white light source, would reflect light which differs in color from what would be reflected by at least one other of the reflection regions 134 if contacted by light from the same white light source.

By shaping the window regions 133 and the reflection regions 134 as desired, and by selecting reflection regions 134 which reflect desired colors, the light filter can be designed to filter a desired proportion (or proportions) of one or more selected colors. In addition, by so shaping the window regions 133 and the reflection regions 134 as desired, and by selecting reflection regions 134 which reflect desired colors, the light filter can be designed to be adjusted by adjusting the position of the first filter component 130 relative to the second filter component 131 so that the colors which are filtered, and the degree of attenuation of all such colors, can be selected by appropriate positioning of the first filter component relative to the second filter component, e.g., by sliding one of the filter components and (1) holding the other filter component in place, (2) sliding the other filter component in an opposite direction and/or (3) sliding the other filter component in the same direction but to a lesser extent.

With regard to any mixed light described herein in terms of its proximity (e.g., in MacAdam ellipses) to the blackbody locus on a 1931 CIE Chromaticity Diagram and/or on a 1976 CIE Chromaticity Diagram, the present inventive subject matter is further directed to such mixed light in the proximity of light on the blackbody locus having color temperature of 2700 K, 3000 K or 3500 K, namely:

mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4578, 0.4101, the second point having x, y coordinates of 0.4813, 0.4319, the third point having x, y coordinates of 0.4562, 0.4260, the fourth point having x, y coordinates of 0.4373, 0.3893, and the fifth point having x, y coordinates of 0.4593, 0.3944 (i.e., proximate to 2700 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4338, 0.4030, the second point having x, y coordinates of 0.4562, 0.4260, the third point having x, y coordinates of 0.4299, 0.4165, the fourth point having x, y coordinates of 0.4147, 0.3814, and the fifth point having x, y coordinates of 0.4373, 0.3893 (i.e., proximate to 3000 K); or mixed light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.4073, 0.3930, the second point having x, y coordinates of 0.4299, 0.4165, the third point having x, y coordinates of 0.3996, 0.4015, the fourth point having x, y coordinates of 0.3889, 0.3690, and the fifth point having x, y coordinates of 0.4147, 0.3814 (i.e., proximate to 3500 K).

Any two or more structural parts of the devices described herein can be integrated. Any structural part of the devices described herein can be provided in two or more parts (which are held together, if necessary). Similarly, any two or more functions can be conducted simultaneously, and/or any function can be conducted in a series of steps.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

The invention claimed is:

1. A lighting device comprising:
a first light source which, if illuminated, emits white light at a first color point;
a first filter which, if said white light emitted from said first light source is directed toward said first filter, would filter at least some blue light from said white light to form modified light at a second color point which is different from the first color point; and
a second light source which, if illuminated, emits light of at least one color selected from among the group consisting of red light and reddish-orange light,
wherein a mixture of said modified light and light emitted from said second light source would produce mixed light which is white light having x, y coordinates on a 1931 CIE Chromaticity Diagram which define a point which is within ten MacAdam ellipses of at least one point on a 1931 CIE Chromaticity Diagram blackbody locus.

2. A lighting device as recited in claim 1, wherein said lighting device further comprises a third light source which, if illuminated, emits white light.

3. A lighting device as recited in claim 1, wherein said modified light, in the absence of any additional light, has x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

4. A lighting device as recited in claim 1, wherein:
said lighting device further comprises a power line,
said first light source and said second light source are electrically connected to said power line, and
if current is supplied to said power line, a combination of (1) light exiting said lighting device which was emitted by said first light source and (2) light exiting said lighting device which was emitted by said second light source would, in an absence of any additional light, produce mixed light, said mixed light being white light.

5. A lighting device as recited in claim 1, wherein said first light source comprises:
at least one first group light emitter, each of said first group light emitters comprising at least one first group solid state light emitter, each of said first group light emitters, if activated, emitting light of a first color; and
at least one second group light emitter, each of said second group light emitters comprising at least one second group solid state light emitter and at least one second group lumiphor, each of said second group light emitters, if activated, emitting light of a second color, said second color different from said first color.

6. A lighting device as recited in claim 5, wherein:
each of said first group light emitters comprises at least one solid state light emitter which, if illuminated, emits UV light;
each of said second group light emitters comprises at least one second group lumiphor; and
said first light source further comprises at least one third group light emitter, each of said third group light emitters, if activated, emitting light of a third color, said third color different from said first color and said second color, each of said third group light emitters comprising at least one third group lumiphor.

7. A lighting device as recited in claim 1, wherein:
said first light source comprises at least one first group light emitter and at least one second group light emitter, each of said first group light emitters, if activated, emitting light of a first color, each of said second group light emitters, if activated, emitting light of a second color, said second color different from said first color,
said first group of light emitters comprises at least one solid state light emitter which, if illuminated, emits light having a peak wavelength in the range of from about 430 nm to about 480 nm; and
said second group of light emitters comprises at least one lumiphor which, if illuminated, emits light having a dominant wavelength in the range of from about 555 nm to about 585 nm.

8. A lighting device as recited in claim 1, wherein:
said first light source comprises at least one first group light emitter and at least one second group light emitter, each of said first group light emitters, if activated, emitting light of a first color, each of said second group light emitters, if activated, emitting light of a second color, said second color different from said first color,
each of said first group light emitters comprises at least one first group lumiphor; and
each of said second group light emitters comprises at least one second group lumiphor.

9. A lighting device as recited in claim 1, wherein:
said first light source comprises at least one first group light emitter and at least one second group light emitter, each of said first group light emitters, if activated, emitting light of a first color, each of said second group light emitters, if activated, emitting light of a second color, said second color different from said first color,
said first light source further comprises at least one third group light emitter, each of said third group light emitters, if activated, emitting light of a third color, said third color different from said first color and said second color,
each of said first group light emitters comprises at least one first group lumiphor and at least one first group solid state light emitter;
each of said second group light emitters comprises at least one second group lumiphor and at least one second group solid state light emitter; and
each of said third group light emitters comprises at least one third group lumiphor and at least one third group solid state light emitter.

10. A lighting device as recited in claim 9, wherein
each of said first group lumiphors, if excited, emits blue light;
each of said second group lumiphors, if excited, emits green light;
each of said third group lumiphors, if excited, emits red light;
each of said first group solid state light emitters, if excited, emits blue light;
each of said second group solid state light emitters, if excited, emits green light; and
each of said third group solid state light emitters, if excited, emits red light.

11. A lighting device as recited in claim 9, wherein
each of said first group lumiphors, if excited, emits blue light;
each of said second group lumiphors, if excited, emits light of at least one color selected from among the group consisting of yellowish-green light, yellow-green light, greenish-yellow light and yellow light;
each of said third group lumiphors, if excited, emits red light;
each of said first group solid state light emitters, if excited, emits blue light;
each of said second group solid state light emitters, if excited, emits light of at least one color selected from among the group consisting of yellowish-green light, yellow-green light, greenish-yellow light and yellow light; and
each of said third group solid state light emitters, if excited, emits red light.

12. A lighting device as recited in claim 1, wherein said first filter, if said white light emitted from said first light source is directed toward said first filter, would filter at least some blue light and at least some yellow light from said white light to form said modified light.

13. A lighting device as recited in claim 1, wherein said first filter is a pass-through filter.

14. A lighting device as recited in claim 1, wherein said first filter is a reflection filter.

15. A lighting device as recited in claim 1, wherein said first filter comprises at least a first filter component and a second filter component,
said first filter component comprising at least a first wall region, said first wall region comprising at least one window region,
said second filter component comprising at least a first reflection region and a second reflection region,
wherein said first reflection region, if a first mixture of light which is white is directed toward said first reflection region, would reflect a first reflected light which differs in color from a second reflection light which would be reflected by said second reflection region if said first mixture of light were directed toward said second reflection region,
at least one of said first filter component and said second filter component movable such that differing portions of said first reflection region can be exposed through said window region, such that if said first mixture of light enters said filter, a color of light exiting said filter can be adjusted by adjusting a positional relationship between said first filter component and said second filter component.

16. A lighting device as recited in claim 1, wherein said white light has a color temperature of at least 4,000K.

17. A lighting device as recited in claim 1, wherein said first filter, if said white light emitted from said first light source is directed toward said first filter, would filter at least 25%, on a mW basis, of said blue light from said white light to form said modified light.

18. A lighting device as recited in claim 1, wherein said first filter, if said white light emitted from said first light source is directed toward said first filter, would filter at least 25%, on a mW basis, of said blue light and at least 25%, on a mW basis, of green light from said white light to form said modified light.

19. A method of lighting, comprising:
illuminating a first light source, whereby said first light source emits a first light mixture, said first light mixture comprising blue light and other light, said first light mixture appearing white at a first color point;
illuminating a second light source, whereby said second light source emits second light of at least one color selected from among the group consisting of red light and reddish-orange light, and
filtering at least a portion of said blue light from said first light mixture so that the first light mixture minus said portion of blue light would be at a second color point which different from the first color point,
a mixture of said first light mixture and said second light minus said portion of blue light providing filtered mixed light, said filtered mixed light being white light at a color point which is within ten MacAdam ellipses of at least one point on a 1931 CIE Chromaticity Diagram blackbody locus.

20. A method as recited in claim 19, wherein:
said method further comprises illuminating a third light source which emits white light.

21. A method as recited in claim 19, wherein if said first light mixture emitted by said first light source were passed through said first filter in the absence of any additional light to form first light filtered light, said first light filtered light would have x, y color coordinates which define a point which is within an area on a 1931 CIE Chromaticity Diagram enclosed by first, second, third, fourth and fifth line segments, said first line segment connecting a first point to a second point, said second line segment connecting said second point to a third point, said third line segment connecting said third point to a fourth point, said fourth line segment connecting said fourth point to a fifth point, and said fifth line segment connecting said fifth point to said first point, said first point having x, y coordinates of 0.32, 0.40, said second point having x, y coordinates of 0.36, 0.48, said third point having x, y coordinates of 0.43, 0.45, said fourth point having x, y coordinates of 0.42, 0.42, and said fifth point having x, y coordinates of 0.36, 0.38.

22. A method as recited in claim 19, wherein said first light source comprises:
    at least one first group light emitter, each of said first group light emitters comprising at least one first group solid state light emitter, each of said first group light emitters emitting light of a first color; and
    at least one second group light emitter, each of said second group light emitters comprising at least one second group solid state light emitter and at least one second group lumiphor, each of said second group light emitters emitting light of a second color, said second color different from said first color.

23. A method as recited in claim 19, wherein:
    said first light source comprises at least one first group light emitter and at least one second group light emitter, each of said first group light emitters emitting light of a first color, each of said second group light emitters emitting light of a second color, said second color different from said first color;
    each of said second group light emitters comprises at least one second group lumiphor;
    each of said first group light emitters comprises at least one solid state light emitter which emits UV light; and
    said first light source further comprises at least one third group light emitter, each of said third group light emitters emitting light of a third color, said third color different from said first color and said second color, each of said third group light emitters comprising at least one third group lumiphor.

24. A method as recited in claim 19, wherein:
    said first light source comprises at least one first group light emitter and at least one second group light emitter, each of said first group light emitters emitting light of a first color, each of said second group light emitters emitting light of a second color, said second color different from said first color;
    said first group of light emitters comprises at least one solid state light emitter which emits light having a peak wavelength in the range of from about 430 nm to about 480 nm; and
    said second group of light emitters comprises at least one lumiphor which emits light having a dominant wavelength in the range of from about 555 nm to about 585 nm.

25. A method as recited in claim 19, wherein:
    said first light source comprises at least one first group light emitter and at least one second group light emitter, each of said first group light emitters emitting light of a first color, each of said second group light emitters emitting light of a second color, said second color different from said first color;
    each of said first group light emitters comprises at least one first group lumiphor; and
    each of said second group light emitters comprises at least one second group lumiphor.

26. A method as recited in claim 19, wherein:
    said first light source comprises at least one first group light emitter and at least one second group light emitter, each of said first group light emitters emitting light of a first color, each of said second group light emitters emitting light of a second color, said second color different from said first color;
    said first light source further comprises at least one third group light emitter, each of said third group light emitters emitting light of a third color, said third color different from said first color and said second color;
    each of said first group light emitters comprises at least one first group lumiphor and at least one first group solid state light emitter;
    each of said second group light emitters comprises at least one second group lumiphor and at least one second group solid state light emitter; and
    each of said third group light emitters comprises at least one third group lumiphor and at least one third group solid state light emitter.

27. A method as recited in claim 26, wherein
    each of said first group lumiphors emits blue light;
    each of said second group lumiphors emits green light;
    each of said third group lumiphors emits red light;
    each of said first group solid state light emitters emits blue light;
    each of said second group solid state light emitters emits green light; and
    each of said third group solid state light emitters emits red light.

28. A method as recited in claim 26, wherein
    each of said first group lumiphors emits blue light;
    each of said second group lumiphors emits light of at least one color selected from among the group consisting of yellowish-green light, yellow-green light, greenish-yellow light and yellow light;
    each of said third group lumiphors emits red light;
    each of said first group solid state light emitters emits blue light;
    each of said second group solid state light emitters emits light of at least one color selected from among the group consisting of yellowish-green light, yellow-green light, greenish-yellow light and yellow light; and
    each of said third group solid state light emitters emits red light.

29. A method as recited in claim 19, wherein said first filter filters at least some blue light and at least some yellow light from said first mixed light.

30. A method as recited in claim 19, wherein said first filter is a pass-through filter.

31. A method as recited in claim 19, wherein said first filter is a reflection filter.

32. A method as recited in claim 19, wherein said first filter comprises at least a first filter component and a second filter component,
    said first filter component comprising at least a first wall region, said first wall region comprising at least one window region,
    said second filter component comprising at least a first reflection region and a second reflection region,
        wherein said first reflection region, if a first mixture of light which is white is directed toward said first reflection region, would reflect a first reflected light which differs in color from a second reflection light which would be reflected by said second reflection region if said first mixture of light is directed toward said second reflection region,
    at least one of said first filter component and said second filter component movable such that differing portions of said first reflection region can be exposed through said window region, such that if said first mixture of light enters said filter, a color of light exiting said filter can be adjusted by adjusting a positional relationship between said first filter component and said second filter component.

33. A method as recited in claim 19, wherein said white light has a color temperature of at least 4,000K.

34. A method as recited in claim 19, wherein said filtered mixed light has a color temperature which is lower than a color temperature of said first light mixture.

35. A method as recited in claim 19, wherein said first filter filters from said first light mixture at least 25%, on a mW basis.

36. A method as recited in claim 19, wherein said first filter filters from said first light mixture at least 25%, on a mW basis, of said blue light and at least 25%, on a mW basis, of green light.

37. A method of lighting as recited in claim 19, wherein:
said filtering at least some blue light comprises directing said first light mixture toward a first filter which filters from said first light mixture at least some blue light to form modified light; and
said first filter and said second light source are positioned and oriented relative to each other such that at least said modified light and said second light mix to form said filtered mixed light.

38. A method of lighting as recited in claim 19, wherein:
said, first light source and said second light source are positioned and oriented relative to each other such that at least said white light and said second light mix to form first mixed light; and
said filtering at least some blue light comprises directing said first mixed light toward a first filter which filters from said first mixed light at least some blue light to form said filtered mixed light.

* * * * *

UNITED STATES PATENT AND TRADEMARK OFFICE
CERTIFICATE OF CORRECTION

PATENT NO. : 8,506,114 B2
APPLICATION NO. : 12/035604
DATED : August 13, 2013
INVENTOR(S) : Antony Paul Van De Ven It is certified that error appears in the above-identified patent and that said Letters Patent is hereby corrected as shown below:

Title Page 4, OTHER PUBLICATIONS (Under Item (56), Col. 1, line 34, References Cited)

Please change: "Van de Ven et al., "Wanu White Illumination with High CRI and High Efficacy by Combining 455 nm Excited Yellowish Phosphor LEDs and Red AlInGaP LEDs", First International Conference on White LEDs and Solid State Lighting."

to -- Van de Ven et al., "Warm White Illumination with High CRI and High Efficacy by Combining 455 nm Excited Yellowish Phosphor LEDs and Red AlInGaP LEDs", First International Conference on White LEDs and Solid State Lighting. --

In the Claims:

Column 32

Claim 19, line 43:

Please insert: -- is -- after -- which --

Signed and Sealed this
Twelfth Day of November, 2013

Teresa Stanek Rea
*Deputy Director of the United States Patent and Trademark Office*